US008329560B2

(12) United States Patent
Lee et al.

(10) Patent No.: US 8,329,560 B2
(45) Date of Patent: Dec. 11, 2012

(54) LASER PROCESSING APPARATUS AND METHOD USING BEAM SPLIT

(75) Inventors: Dong Jun Lee, Seoul (KR); Jung Rae Park, Gyeonggi-do (KR); Hak Yong Lee, Seoul (KR); Young Hoon Kwon, Gyeonggi-do (KR)

(73) Assignee: EO Technics Co., Ltd., Gyeonggi-do (KR)

( * ) Notice: Subject to any disclaimer, the term of this patent is extended or adjusted under 35 U.S.C. 154(b) by 505 days.

(21) Appl. No.: 12/670,159

(22) PCT Filed: May 6, 2008

(86) PCT No.: PCT/KR2008/002531
§ 371 (c)(1),
(2), (4) Date: Jan. 22, 2010

(87) PCT Pub. No.: WO2009/014307
PCT Pub. Date: Jan. 29, 2009

(65) Prior Publication Data
US 2010/0187207 A1 Jul. 29, 2010

(30) Foreign Application Priority Data

Jul. 24, 2007 (KR) .................. 10-2007-0074174
Feb. 22, 2008 (KR) .................. 10-2008-0016162

(51) Int. Cl.
*H01L 21/30* (2006.01)
*H01L 21/461* (2006.01)
*B23K 26/36* (2006.01)

(52) U.S. Cl. ............ 438/460; 219/121.68; 219/121.69; 219/121.75; 219/121.77; 438/462; 438/463

(58) Field of Classification Search ............. 219/121.68, 219/121.69, 121.75, 121.77; 438/460, 462, 438/463; 451/54
See application file for complete search history.

(56) References Cited

U.S. PATENT DOCUMENTS
7,265,033 B2 * 9/2007 Shigematsu et al. .......... 438/463
2002/0151115 A1 * 10/2002 Nakajima et al. ............. 438/149

FOREIGN PATENT DOCUMENTS
JP   2005-021940 A   1/2005
JP   2005-109323 A   4/2005
JP   2005-118832 A   5/2005

OTHER PUBLICATIONS
International Search Report: PCT/KR2008/002531.

\* cited by examiner

*Primary Examiner* — Samuel M Heinrich
(74) *Attorney, Agent, or Firm* — Ladas & Parry LLP

(57) ABSTRACT

Disclosed are a laser processing apparatus and method that can effectively remove a low-k material formed on a wafer. A laser processing apparatus of the invention is a laser processing apparatus that processes a subject on which a low-k material is formed. The laser processing apparatus includes a laser generating unit that emits a laser beam; and an optical system that splits the laser beam emitted from the laser generating unit into two and irradiates the split laser beams onto the subject In this case, the optical system includes a pair of condensing lenses in which cut surfaces that are cut at a predetermined distance from central axes to be parallel to the central axes contact with each other, and the interval between the two split laser beams is the same as the interval between two edges of the low-k material in a removal subject region. According to the invention, after splitting a laser beam into two laser beams and primarily removing the edges of the low-k material in the removal subject region using the laser beams, the remaining low-k material between the edges is removed. As a result, it is possible to improve processing quality.

48 Claims, 22 Drawing Sheets

A

Fig. 18
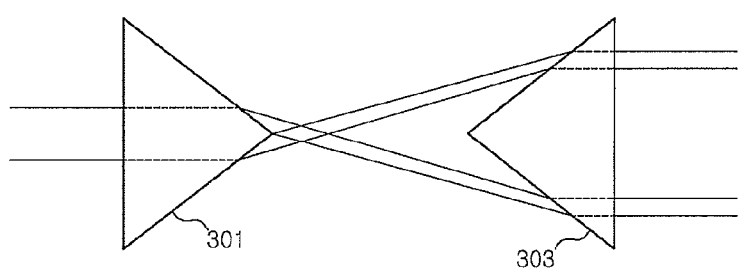
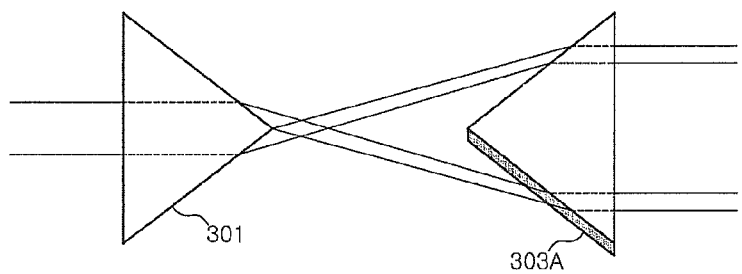
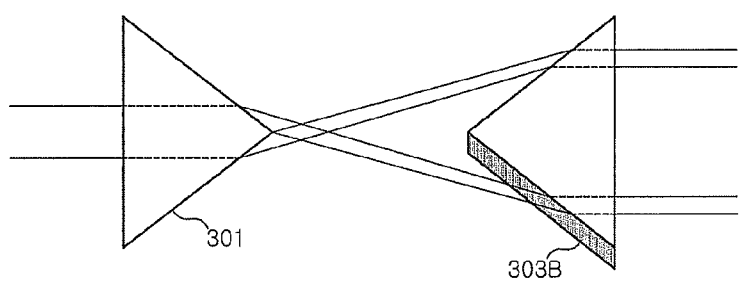

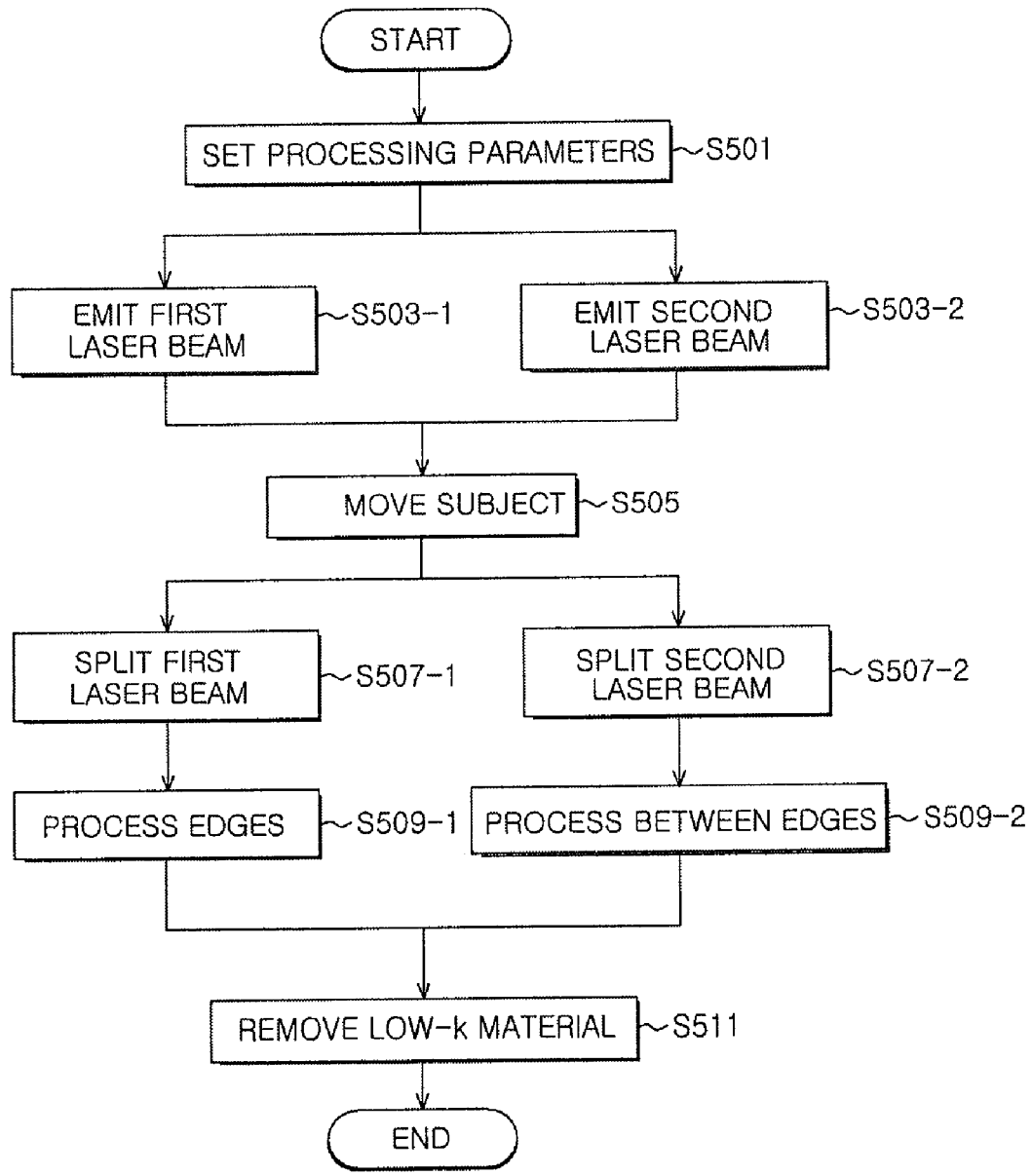

LASER PROCESSING APPARATUS AND METHOD USING BEAM SPLIT

TECHNICAL FIELD

The present invention relates to a laser processing apparatus and method, and more particularly, to a laser processing apparatus and method that are capable of effectively removing a low-k material that is formed on a wafer.

RELATED ART

In general, in a process of manufacturing a semiconductor element, a low-k material is used for pattern formation and insulation. However, since the low-k material has high viscosity, when a wafer is processed by a mechanical method in a subsequent process, the low-k material adheres to a saw, causing the saw to be worn and decreasing a processing speed. When the low-k material is processed, a lump of low-k material may be removed and a processing surface becomes dull. The low-k material in a region other than a removal subject region is also removed, which lowers productivity.

In order to prevent this problem, a method has been studied in which the low-k material is preferentially removed using a laser before processing a wafer. At the time of general laser processing, the processing is performed with a narrow cutting width, but at the time of removing the low-k material, the processing needs to be performed with a main cutting width needed to actually remove the low-k material, for example, a cutting width that is wider than a width of mechanical sawing.

As a laser processing method that has been suggested to remove the low-k material, there is a method in which the low-k material is removed with a large spot size of 60 μm or more using a laser that has a wavelength range equal to or wider than an infrared wavelength range. According to this method, an optical system can be easily configured and the method can be easily implemented.

Further, since output power of the laser that has a wavelength range equal to or wider than the ultraviolet wavelength range is high as 100 W or more, processing power can be flexibly applied. The spot size at the time of laser processing is determined by the following Equation 1.

$$\text{Spot size} \doteqdot 4\lambda F / \Pi D M^2 \qquad \text{[Equation 1]}$$

In Equation 1, $\lambda$ indicates a wavelength of a laser, F indicates a focal distance of a condensing lens, and D indicates the aperture of a laser beam that is incident on the condensing lens.

$M^2$ as a factor, which indicates quality of a laser beam, is defined by $M^2 \doteqdot \Pi w(z0)w(z)/z\lambda$. In this case, $w(z)$ indicates a beam waist after the laser beam propagates, and $w(z0)$ indicates a minimum value of the beam waist. In general, light diffuses when the light propagates, but a laser beam has linearity that does not diffuse even when the laser beam propagates. In the above expression that defines $M^2$, $M^2$ is derived by infinitely approximating z and may have a value of about 1.0 or a value of 30 or more, that is, various values. Therefore, when the wavelength is lengthened, the value of $M^2$ increases. A laser that can achieve a small value of $M^2$ is considered to be expensive equipment having excellent beam quality.

As can be seen from Equation 1, the wavelength of the laser and the focal distance of the condensing lens determine the spot size of the laser beam. The focal distance of the condensing lens may change depending on an equipment design. However, a minimal focal distance that is capable of protecting the condensing lens from being contaminated at the time of processing is about 20 mm. In the case of massively produced products, the focal distance of the condensing lens becomes different according to a wavelength range of the laser, but the focal distance is in a range of 50 to 300 mm. The spot size of the laser beam that has a wavelength longer than the infrared wavelength is in a range of approximately 1 to 10 μm in theory. The spot size of the laser beam that has the ultraviolet wavelength or visible ray wavelength is approximately several hundred nanometers. If the value of the spot size is substituted for Equation 1, it can be known that the minimal spot size increases when the wavelength is lengthened.

A $CO_2$ laser that is used to remove the low-k material or a pattern layer may have a spot size of 50 μm in theory and a theoretical limit value thereof is approximately 50±10 μm.

FIG. 1 is a diagram illustrating a problem that occurs at the time of removing a low-k material using a $CO_2$ laser.

As shown in FIG. 1, when the low-k material is removed using the $CO_2$ laser, it can be seen that a processing edge A becomes dull due to melting. When the $CO_2$ laser, which has a wavelength longer than a visible ray wavelength, is incident on silicon used as a main material that forms a semiconductor substrate, an absorption rate is approximately zero. As a result, most of the laser beams do not process the silicon, but damages a transfer device.

The low-k material has mechanical/optical properties different from those of formation materials of the wafer substrate, for example, Si, Ge, and GaAs. Thus, the low-k material may show a different reaction according to a wavelength, a beam size, and processing parameter of the laser, and this difference may cause the deterioration in the processing quality.

Accordingly, in the case where the low-k material is removed using a laser beam, if the kind of wafer or a width of a processing portion changes, a condensing lens and an optical system should be changed, which is inconvenient for a user.

As such, even though the method has been studied in which the low-k material is removed by laser processing, the above-described problems cannot be resolved. Accordingly, another method is being studied in which the low-k material is removed using mechanical processing.

As a result, the fact that, if a processing width is reduced and mechanical processing is performed, it is possible to effectively remove the low-k material was discovered. In this case, however, when a width of a mechanical saw for processing substrate material such as silicon that is the main portion of the processing material, that is, a width of a processing portion is large, mechanical processing should be repeated a plurality of times, which decreases the processing speed.

Therefore, the corresponding method is not effective.

SUMMARY OF THE INVENTION

The invention has been finalized in order to solve the above-described problems. A technical object of the invention is to provide a laser processing apparatus and method using beam split in which edges of a low-k material in a removal subject region are removed by a laser beam at the time of processing a wafer on which the low-k material is formed and then the remaining low-k material between the edges is removed, thereby improving processing efficiency of a subject.

Another technical object of the invention is to provide a laser processing apparatus and method using beam split in which edges of a low-k material in a removal subject region are primarily removed by a laser beam at the time of processing a wafer on which the low-k material is formed while the remaining low-k material between the edges is removed by a laser beam, thereby improving processing efficiency of a subject and increasing a processing speed thereof.

Still another technical object of the invention is to provide a laser processing apparatus and method in which a laser beam is split into four laser beams at the time of processing a wafer on which the low-k material is formed and the low-k material of edges of a removal subject region at both sides and the low-k material between the edges are simultaneously removed, thereby minimizing resistance applied by the low-k material during a subsequent process.

BRIEF DESCRIPTION OF THE DRAWINGS

FIGS. 17 to 19 are diagrams illustrating the concept of splitting a beam by a beam splitting unit using a prism.

FIG. 22 is a flowchart illustrating a laser processing method according to a fifth embodiment of the invention.

DESCRIPTION OF EXEMPLARY EMBODIMENT

Figure 1:
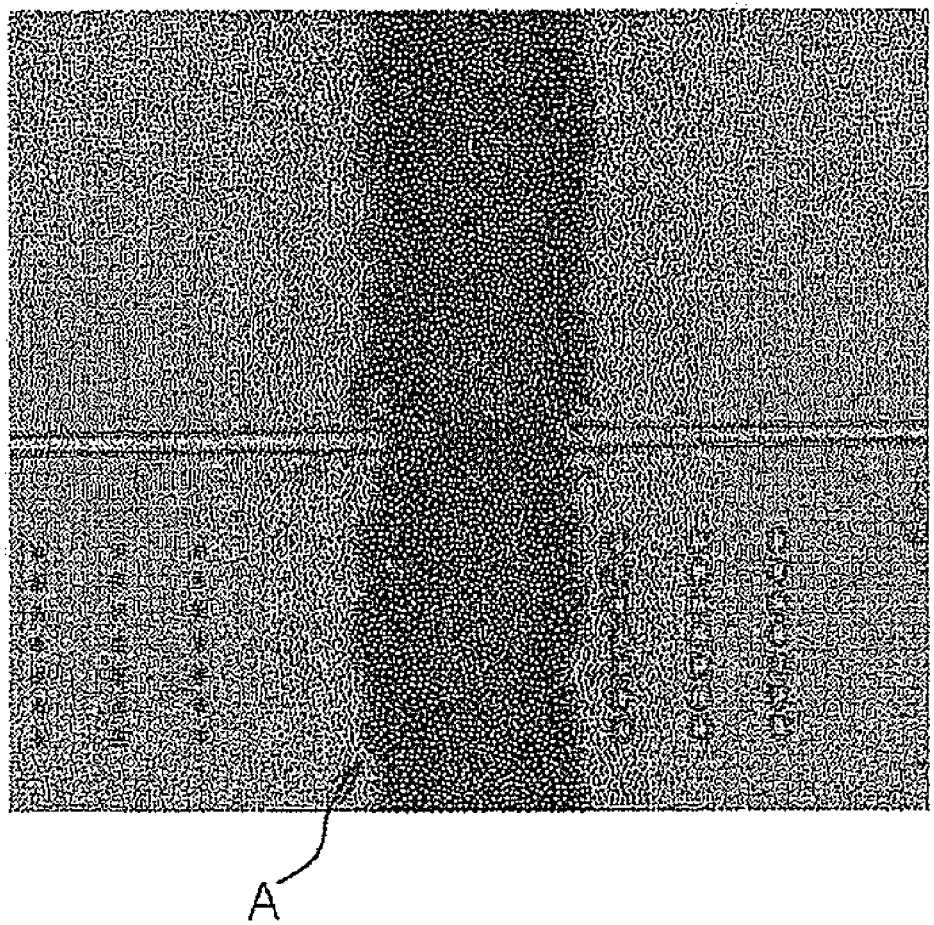
FIG. 1 is a diagram illustrating a problem that occurs when removing a low-k material using a $CO_2$ laser.

A laser processing apparatus according to a first embodiment of the invention for achieving the above-described technical objects is a laser processing apparatus that processes a subject on which a low-k material is formed. The laser processing apparatus includes a laser generating unit that emits a laser beam; and an optical system that splits the laser beam emitted from the laser generating unit into two and irradiates the split laser beams onto the subject. In this case, the optical system includes a pair of condensing lenses in which cut surfaces that are cut at a predetermined distance from central axes to be parallel to the central axes contact with each other, and the interval between the two split laser beams is the same as the interval between two edges of the low-k material in a removal subject region.

A laser processing apparatus according to a second embodiment of the invention is a laser processing apparatus that processes a subject on which a low-k material is formed. The laser processing apparatus includes a laser generating unit that emits a laser beam; a beam splitting unit that splits the laser beam emitted from the laser generating unit into two; an optical system that splits a first laser beam split by the beam splitting unit into two, such that the interval between the two split laser beams is the same as the interval between two edges of the low-k material in a removal subject region, and irradiates the split laser beams onto the subject; and a mirror that receives a second laser beam split by the beam splitting unit and allows the second laser beam to be irradiated onto the low-k material between the two edges. In this case, the optical system includes a pair of condensing lenses in which cut surfaces that are cut at a predetermined distance from central axes to be parallel to the central axes contact with each other.

A laser processing apparatus according to a third embodiment of the invention is a laser processing apparatus that processes a subject on which a low-k material is formed. The laser processing apparatus includes a first laser generating unit that emits a laser beam; an optical system that splits the laser beam emitted from the first laser generating unit into two, such that the interval between the two split laser beams is the same as the interval between edges of the low-k material in a removal subject region, and allows the split laser beams to be incident on the subject; a second laser generating unit that emits a laser beam; and a mirror that allows the laser beam emitted from the second laser generating unit to be irradiated onto the low-k material between the two edges. In this case, the optical system includes a pair of condensing lenses in which cut surfaces that are cut at a predetermined distance from central axes to be parallel to the central axes contact with each other.

A laser processing apparatus according to a fourth embodiment of the invention is a laser processing apparatus a laser processing apparatus that processes a subject on which a low-k material is formed. The laser processing apparatus includes a laser generating unit that emits a laser beam; a first laser beam splitting unit that splits the laser beam emitted from the laser generating unit into two; a second laser beam splitting unit that splits a first laser beam emitted from the first laser beam splitting unit into two and irradiates the split laser beams onto two edges of the low-k material in a removal subject region; and a third laser beam splitting unit that splits a second laser beam emitted from the first laser beam splitting unit into at least two and irradiates the splits laser beams onto a region between the edges of the removal subject region.

A laser processing apparatus according to a fifth embodiment of the invention a laser processing apparatus that processes a subject on which a low-k material is formed. The laser processing apparatus includes a first laser generating unit that emits a laser beam; a first laser beam splitting unit that splits the laser beam emitted from the first laser generating unit into two and irradiates the laser beams onto edges of a removal subject region of the low-k material at both sides; a second laser generating unit that emits a laser beam; and a second laser beam splitting unit that splits a second laser beam emitted from the second laser generating unit into at least two and irradiates the split laser beams onto a region between the edges of the removal subject region.

A laser processing method according to a first embodiment of the invention is a laser processing method that processes a subject on which a low-k material is formed. The laser processing method includes a first step of providing an optical system, which includes a pair of condensing lenses in which cut surfaces that are cut at a predetermined distance from central axes to be parallel to the central axes contact with each other; a second step of setting processing parameters, which include locations of edges of the low-k material in a removal subject region, an interval between the edges, and output power of a laser beam; a third step of emitting a laser beam; a fourth step of splitting the laser beam into two using the optical system; and a fifth step of irradiating the two split laser beams onto the two edges of the low-k material in the removal subject region.

A laser processing method according to a second embodiment of the invention is a laser processing method that processes a subject on which a low-k material is formed. The laser processing method includes a first step of providing an optical system, which includes a pair of condensing lenses in which cut surfaces that are cut at a predetermined distance from the central axes to be parallel to the central axes contact with each other; a second step of setting processing parameters, which include locations of edges of the low-k material in a removal subject region, an interval between the edges, and output power of a laser beam; a third step of emitting a first laser beam; a fourth step of splitting the first laser beam emitted in the third step into two using the optical system; a fifth step of irradiating the laser beams split into two in the fourth step onto the two edges of the low-k material in the removal subject region; a sixth step of emitting a second laser beam; and a seventh step of irradiating the second laser beam emitted in the sixth step onto a region between the two edges.

A laser processing method according to a third embodiment of the invention is a laser processing method that processes a subject on which a low-k material is formed. The laser processing method includes a first step of setting processing parameters, which include locations of edges of the low-k material in a removal subject region, an interval between the edges, and output power of a laser beam; a second step of emitting a laser beam; a third step of splitting the laser beam into two; a fourth step of splitting a first laser beam between the laser beams split into two in the third step into two and irradiating the split laser beams onto edges of the low-k material in the removal subject region at both sides; and a fifth step of splitting a second laser beam between the laser beams split into two in the third step into at least two and irradiating the split laser beams onto portions between the edges of the low-k material in the removal subject region.

A laser processing method according to a fourth embodiment of the invention is a laser processing method that processes a subject on which a low-k material is formed. The laser processing method includes a first step of setting processing parameters, which include locations of edges of the low-k material in a removal subject region, an interval between the edges, and output power of a laser beam; a second step of emitting a first laser beam; a third step of splitting the first laser beam emitted in the second step into two and irradiating the split laser beams onto edges of the low-k material in the removal subject region at both sides; a fourth step of emitting a second laser beam; and a fifth step of splitting the second laser beam emitted in the fourth step into two and irradiating the split laser beams onto portions between the edges of the low-k material in the removal subject region.

Embodiments of the invention will now be described in detail with reference to the accompanying drawings.

Figure 2:
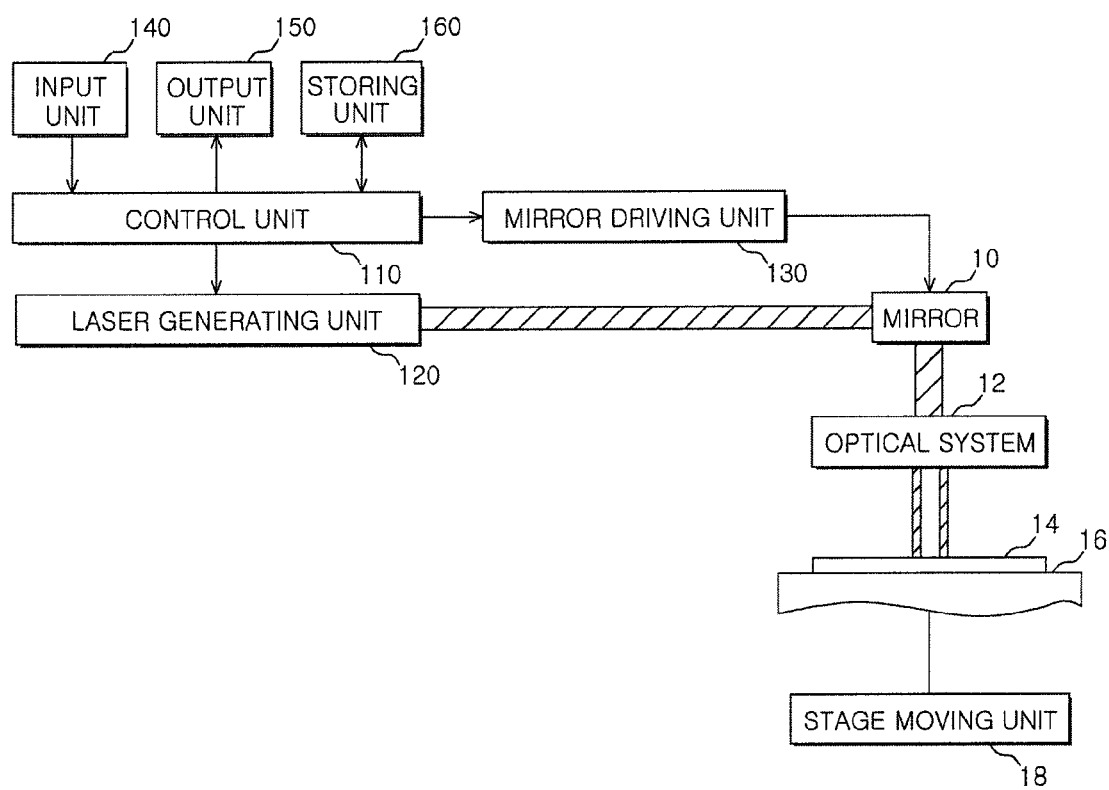
FIG. 2 is a diagram illustrating a structure of a laser processing apparatus according to a first embodiment of the invention.

FIG. 2 is a diagram illustrating a structure of a laser processing apparatus according to a first embodiment of the invention.

As shown in FIG. 2, a laser processing apparatus according to an embodiment of the invention includes a control unit 110, a laser generating unit 120, a mirror driving unit 130, an input unit 140, an output unit 150, a storage unit 160, a mirror 10, and an optical system 12. In this case, the control unit 110 controls the entire operation of the laser processing apparatus, the laser generating unit 120 outputs a laser beam that has a predetermined aperture, and the mirror driving unit 130 drives the mirror 10. The input unit 140 inputs control parameters and control commands, the output unit 150 displays information, such as an operational state, and the storage unit 160 stores data. The mirror 10 changes a propagation direction of the laser beam that is emitted from the laser generating unit 120, and the optical system 12 condenses and splits the laser beam that is reflected on the mirror 10 and irradiates the split laser beams onto edges of a low-k material in a removal subject region.

A subject 14 that has a low-k material formed thereon is mounted on a stage 16, and the stage 16 moves in a predetermined direction by a stage moving unit 18.

Here, the mirror 10 may be implemented using a reflection mirror or polygon mirror. When the mirror 10 is implemented using the polygon mirror, the polygon mirror is preferably a polygon mirror that is manufactured such that the number of reflection surfaces is controlled for the aperture of a laser beam to cover a plurality of reflection surfaces of the polygon mirror. Meanwhile, a laser processing apparatus using a polygon mirror is disclosed in Korean Patent Application No. 10-2004-0022270 filed in the Korean Intellectual Property Office on Mar. 31, 2004 by the present applicant. A laser processing apparatus using a polygon mirror that is manufactured such that the number of reflection surfaces is controlled is disclosed in Korean Patent Application No. 10-2004-0065066 filed in the Korean Intellectual Property Office on Aug. 18, 2004 by the present applicant. In regards to these, the detailed description thereof will be omitted.

The optical system 12 that is used to condense and split the laser beam may have a structure in which two condensing lenses contact each other. The structure of the optical system 12 will be described in detail below with reference to FIGS. 3 and 4.

Figure 3A:
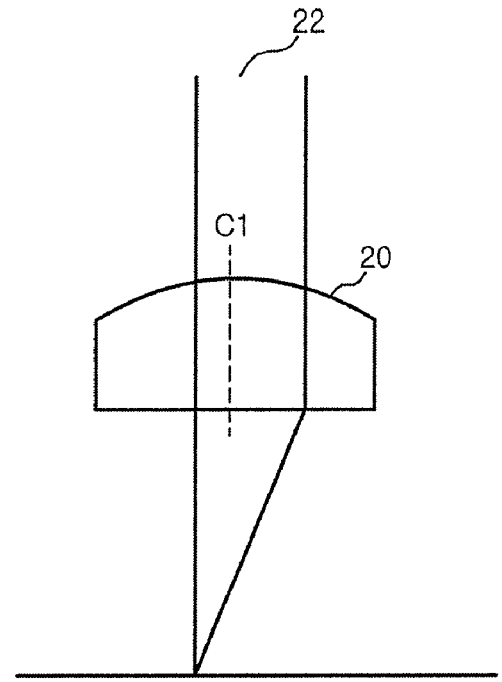
FIGS. 3A and 3B are diagrams illustrating the principle of splitting a laser beam in an optical system that is applied to the invention.
Figure 3B:
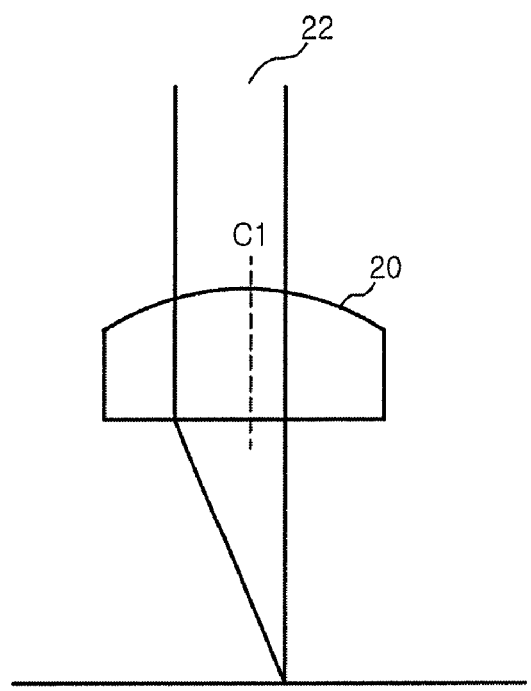
Figure 4:
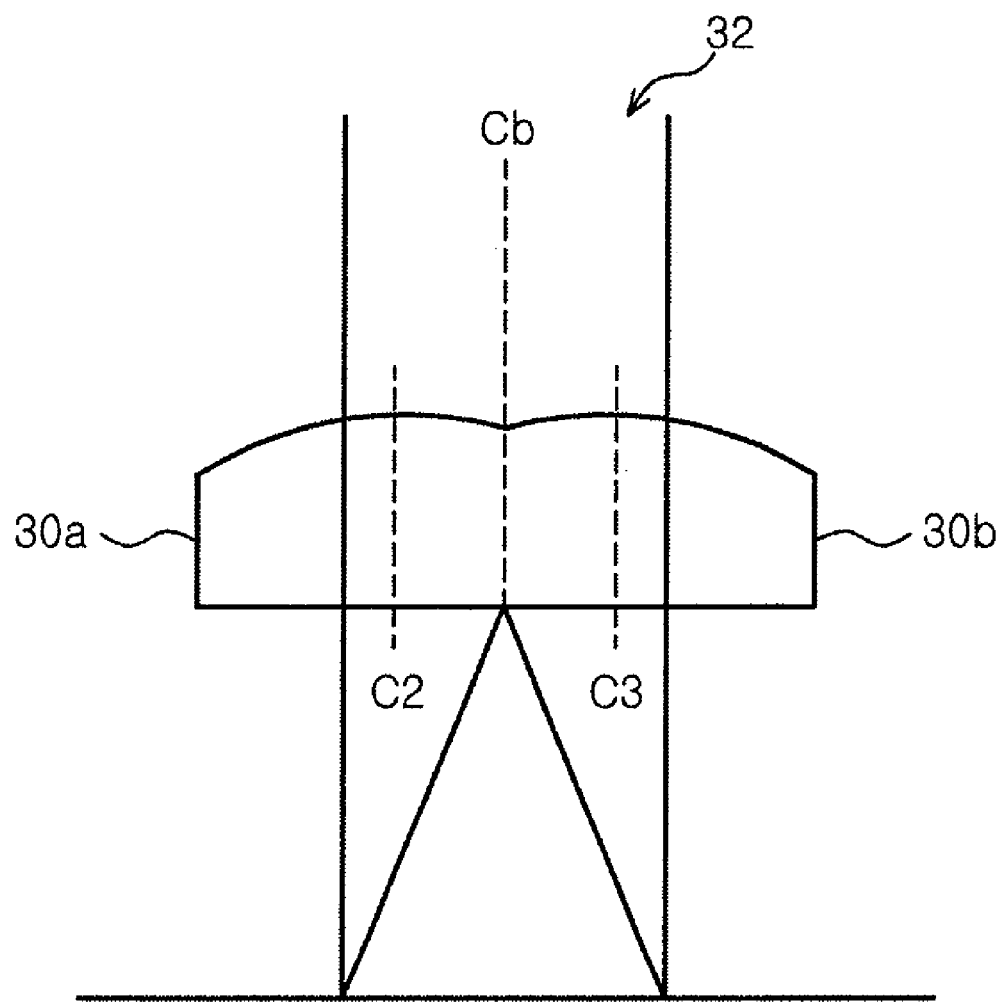
FIG. 4 is an exemplary view illustrating an optical system that is applied to the invention.

FIGS. 3A and 3B are diagrams illustrating the principle of splitting a laser beam in an optical system that is applied to the invention, and FIG. 4 is an exemplary view illustrating an optical system that is applied to the invention.

First, FIG. 3A shows a condensing result in the case where a laser beam 22 is incident on a condensing lens 20 such that the center of the laser beam 22 inclines to the right from the center C1 of the condensing lens 20. FIG. 3B shows a condensing result in the case where the laser beam 22 is incident on the condensing lens 20 such that the center of the laser beam 22 inclines to the left from the center C1 of the condensing lens 20.

As can be seen from FIGS. 3A and 3B, if the center C1 of the condensing lens does not align with the center of the laser beam, a condensing location of the laser beam that has passed through the condensing lens 20 changes. Using this principle, one laser beam is split into two laser beams in the invention.

FIG. 4 shows the case where two condensing lenses 30a and 30b contact each other after cutting parts of the condensing lenses 30a and 30b and a laser beam 32 is incident on the condensing lenses 30a and 30b such that a contact surface of the condensing lenses 30a and 30b align the center of the laser beam 32, thereby splitting one laser beam 32 into two laser beams.

Specifically, portions of the condensing lenses 30a and 30b that are a predetermined distance apart from the central axes C2 and C3 thereof are cut to be parallel to the central axes C2 and C3, and cut surfaces of the condensing lenses 30a and 30b that include the central axes C2 and C3 contact each other. At this time, the condensing lenses 30a and 30b need to be in contact with each other such that the condensing lenses are symmetrical on the basis of the contact surface.

In this state, if a laser beam is incident on the condensing lenses 30a and 30b such that the contact surface of the two condensing lenses 30a and 30b aligns the center Cb of the laser beam 32, the laser beam is condensed on the central axes C2 and C3 of the condensing lenses 30a and 30b. As a result, one laser beam 32 can split into two laser beams.

At this time, if the cutting locations of the condensing lenses 30a and 30b or the aperture of the incident laser beam 32 is adjusted, it is possible to change an interval between the split laser beams.

Of course, the aperture of the incident laser beam 32 is equal to or larger than the distance between the two central axes C2 and C3 of the two condensing lenses 30a and 30b, which contact each other.

Meanwhile, sectional shapes of laser beams that are emitted from the optical system 12 are shaped to have elliptical shapes using a cylindrical lens (not shown) before irradiating the laser beams onto the subject 14, and a control operation is performed such that the major axes of the ellipses align the processing direction, which results in obtaining superior processing efficiency.

Figure 5:
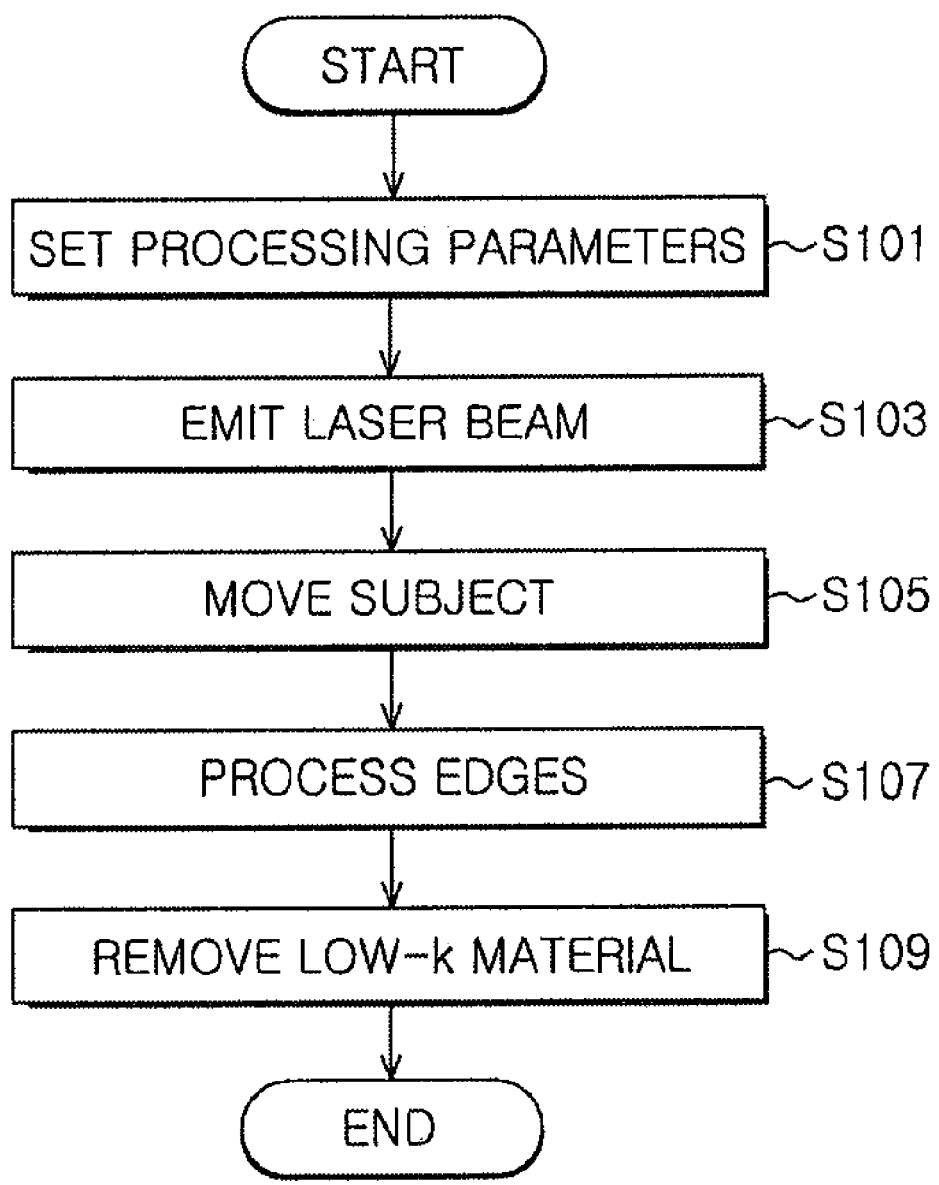
FIG. 5 is a flowchart illustrating a laser processing method according to a first embodiment of the invention.

FIG. 5 is a flowchart illustrating a laser processing method according to a first embodiment of the invention.

When the subject 14 is processed using the laser processing apparatus shown in FIG. 2, first, control parameters are set by the input unit 140 (S101). In the control parameter setting process, the control parameters are registered in a predetermined menu according to a kind or processing type of the processing subject and stored in a storage unit 160. Then, the control parameter setting process can be easily performed by selecting from the menu, if necessary. At this time, the locations of edges of the low-k material in a removal subject region, the interval between the edges, and output power of a laser beam are set as the control parameters.

If the control parameters are completely set, the location of the mirror 10 is adjusted by the mirror driving unit 130 and a laser beam is emitted (S103). When the mirror 10 is composed of a polygon mirror, the mirror 10 rotates at a constant speed according to the predetermined rotation speed. The control unit 110 operates the stage moving unit 18 to move the subject 14 in a predetermined direction (for example, direction opposite to a processing direction where a laser beam is irradiated onto a subject) (S105). The laser beam that is emitted when the laser generating unit 120 is controlled is incident on the optical system 12 through the mirror 10.

Even though the movement of the subject is not essential, if the subject is moved in a direction opposite to a processing direction, the processing speed can be increased.

At this time, a control operation is preferably performed such that the center of the laser beam aligns the contact surface of the two lenses constituting the optical system 12 and the aperture of the laser beam is larger than the distance between the central axes of the two lenses. Further, the laser beam that is incident on the optical system 12 is condensed in accordance with focal points of the two lenses constituting the optical system 12 and split into two laser beams. The split laser beams are vertically irradiated onto the two edges of the removal subject region of the low-k material that is formed on the subject 14 (S107). In this case, since the laser beam is split into two laser beams after passing through the optical system 12, it is possible to simultaneously process the two edges of the removal subject region.

After removing the edges of the low-k material in the removal subject region using the above-described method, the remaining low-k material between the two edges is removed using a mechanical method or laser processing method (S109).

In this embodiment, processing on the edges of the low-k material in the removal subject region and processing on the remaining low-k material between the two edges are independently performed. Thus, if the processing on the edges and the processing on the remaining low-k material are simultaneously performed, it is expected that the processing speed can be further increased. This will now be described in detail with reference to FIGS. 6 to 9.

Figure 6:
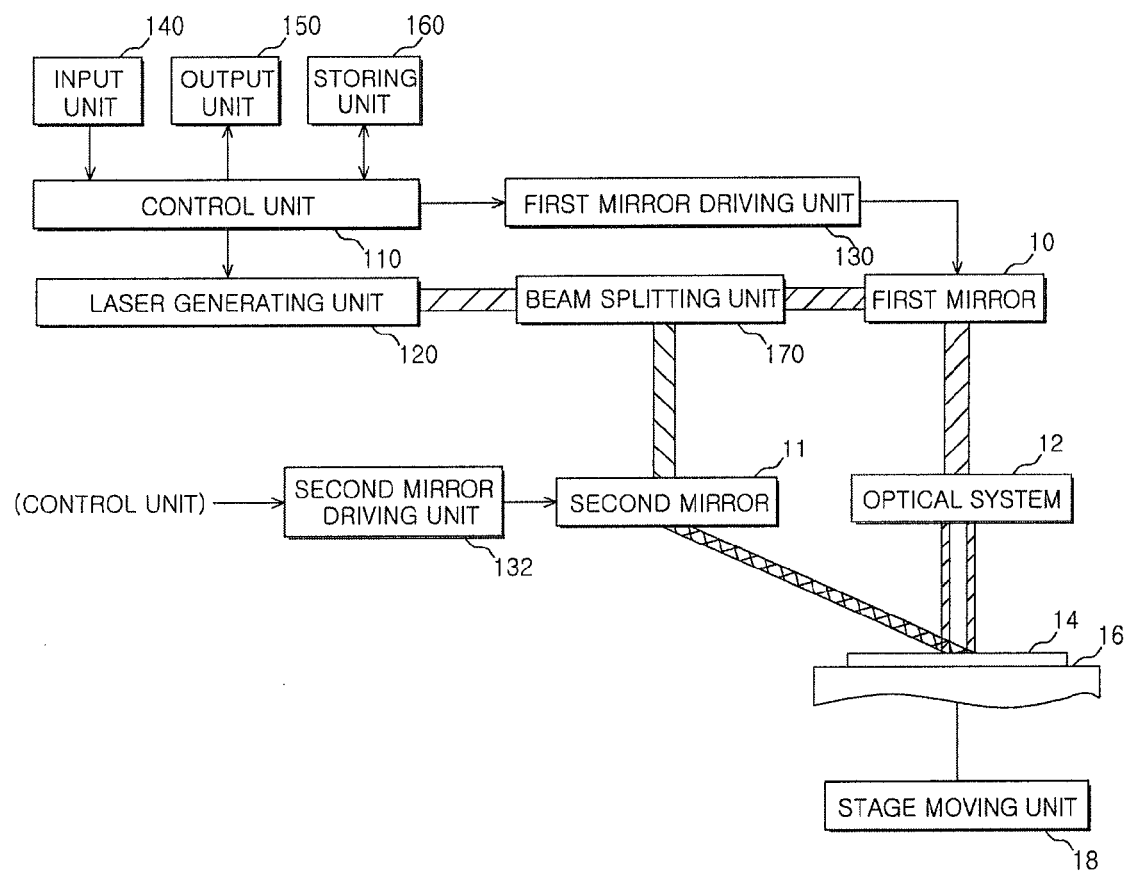
FIG. 6 is a diagram illustrating a structure of a laser processing apparatus according to a second embodiment of the invention.

FIG. 6 is a diagram illustrating a structure of a laser processing apparatus according to a second embodiment of the invention.

In addition to the components of the laser processing apparatus shown in FIG. 2, the laser processing apparatus according to this embodiment further includes a beam splitting unit 170, a second mirror 11, and a second mirror driving unit 132. The beam splitting unit 170 splits a laser beam that is emitted from the laser generating unit 120. One of the laser beams that are split by the beam splitting unit 170 is incident on the second mirror 11. The second mirror driving unit 132 controls the operation of the second mirror 11.

Specifically, the beam splitting unit 170 splits a laser beam emitted from the laser generating unit 120 into first and second laser beams and allows the first and second laser beams to be incident on the first mirror 10 and the second mirror 11, respectively. Similar to the description given with reference to FIG. 2, the first laser beam that is incident on the first mirror 10 is split into two laser beams by the optical system 12 and the two laser beams process the edges of the low-k material in the removal subject region.

Meanwhile, the second laser beam that is incident on the second mirror 11 is used to remove the low-k material that exists between the edges of the low-k material in the removal subject region.

In this embodiment, the beam splitting unit 170 may be implemented by using a unit capable of splitting one laser beam into two laser beams, such as a pair of prisms and a beam splitter. A spot size of a laser beam that is emitted from the second mirror 11 is preferably set to have a value that is obtained by subtracting the width of the removal subject region by the widths of the two edges that are removed by the split laser beams emitted from the optical system 12.

Figure 7:
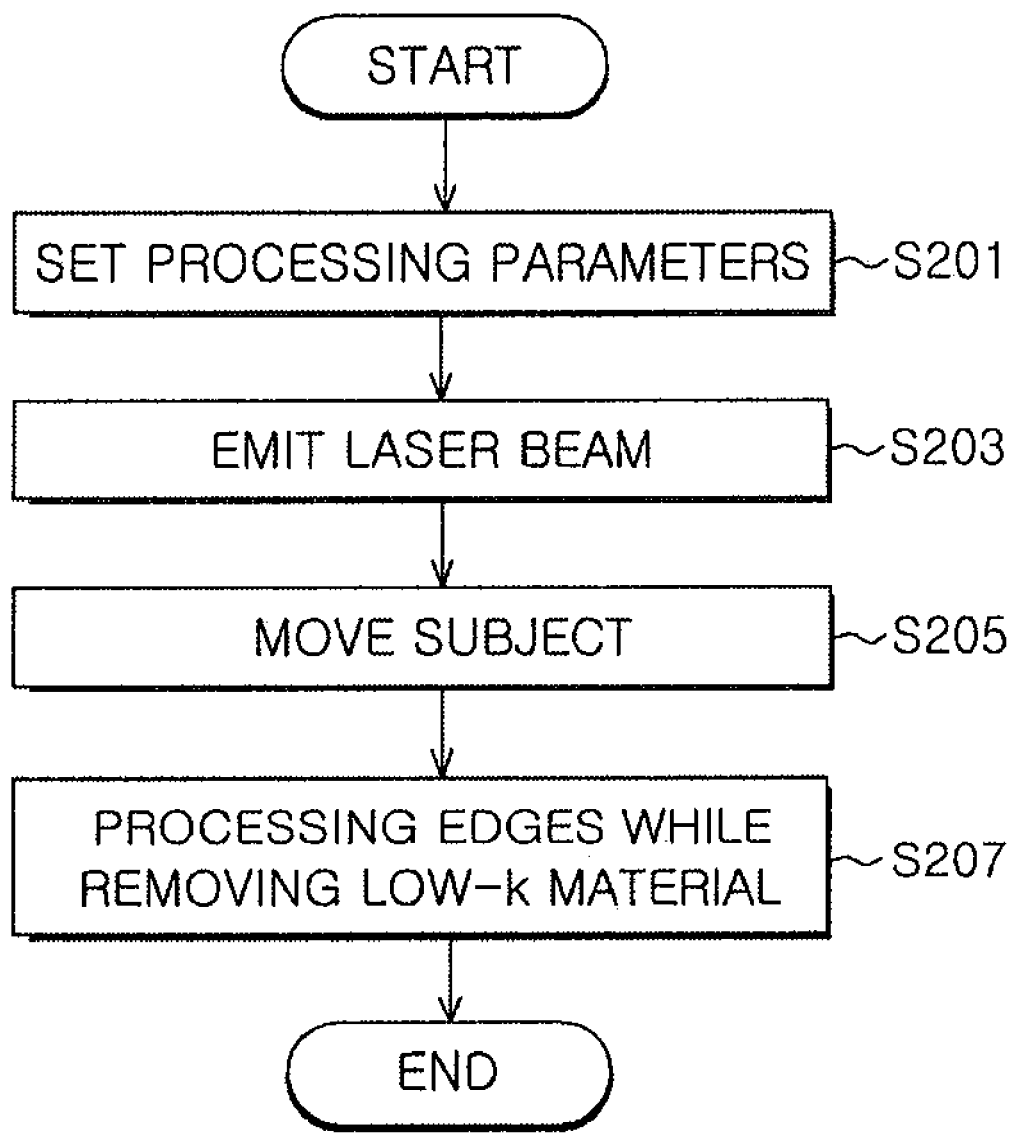
FIG. 7 is a flowchart illustrating a laser processing method according to a second embodiment of the invention.

FIG. 7 is a flowchart illustrating a laser processing method according to a second embodiment of the invention.

In order to simultaneously remove the edges of the removal subject region of the subject on which the low-k material is formed and the remaining material between the edges, first, processing parameters are set according to the kind and processing type of the processing subject (S201). For example, the locations of the edges of the low-k material in the removal subject region, the interval between the edges, and output power of the first and second laser beams are set as the processing parameters.

Then, the laser beam is emitted from the laser generating unit 120 (S203), and the stage is moved by the stage moving unit 18 to move the subject 14 in a direction opposite to a processing direction (S205). Even though the movement of the subject is not essential, if moving the subject in the direction opposite to the processing direction, it is possible to increase the processing speed.

The laser beam that is emitted from the laser generating unit 120 is split into the first laser beam and the second laser beam by the beam splitting unit 170. At this time, the first laser beam is incident on the two edges of the low-k material in the removal subject region through the first mirror 10 and the optical system 12 so as to remove the edges. At the same time, the second laser beam is irradiated between the two edges of the low-k material in the removal subject region through the second mirror 11 so as to remove the remaining low-k material between the two edges (S207).

Figure 8:
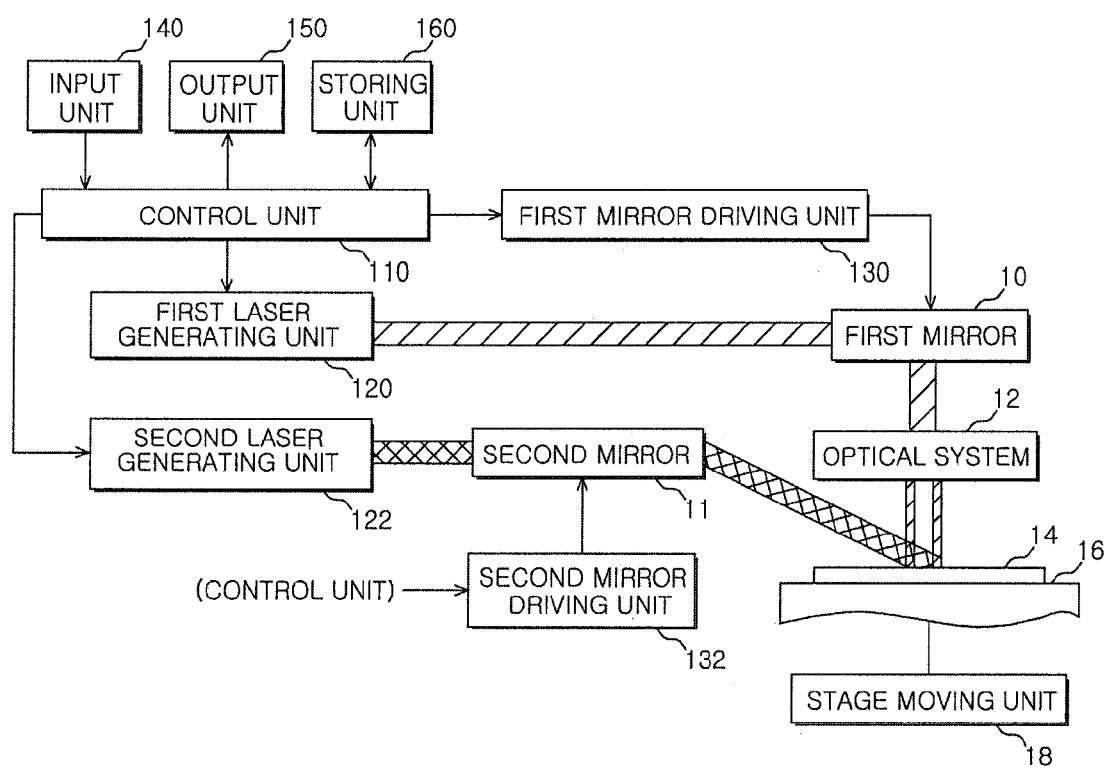
FIG. 8 is a diagram illustrating a structure of a laser processing apparatus according to a third embodiment of the invention.

FIG. 8 is a diagram illustrating a structure of a laser processing apparatus according to a third embodiment of the invention.

In addition to the components of the laser processing apparatus shown in FIG. 2, the laser processing apparatus according to this embodiment further includes a second laser generating unit 122, a second mirror 11, and a second mirror driving unit 132.

Similar to the description given with reference to FIG. 2, the first laser beam that is emitted from the first laser generating unit 120 is incident on the optical system 12 though the first mirror 10. The optical system 12 may be configured such that the cut surfaces of the two condensing lenses, which are cut such that the portions, which are apart from the central axes by a predetermined distance, are parallel to the central axes, contact each other. When the center of the laser beam aligns the contact surface of the condensing lenses, one laser beam is split into two laser beams. The laser beams that are split by the optical system 12 are irradiated onto the two edges of the low-k material in the removal subject region so as to remove the low-k material of the two edges.

Meanwhile, the second laser beam that is emitted from the second laser generating unit 122 is reflected on the second mirror 11 and irradiated onto the subject 14. At this time, the second laser beam is irradiated between the two edges of the low-k material in the removal subject region, and removes the remaining low-k material between the two edges after removing the two edges using the first laser beam.

In this case, the second laser generating unit 122 is preferably driven at the predetermined time after the first laser generating unit 120 is driven. The spot size of the laser beam that is emitted from the second laser generating unit 122 is preferably set to have a value that is obtained by subtracting the width of the removal subject region by the widths of the two edges, which are removed by the first laser beam.

Meanwhile, a laser that is emitted from the second laser generating unit 122 may be one of UV ViS (Ultra Violet Visible), IR (Intra Red), and $CO_2$ lasers.

Figure 9:
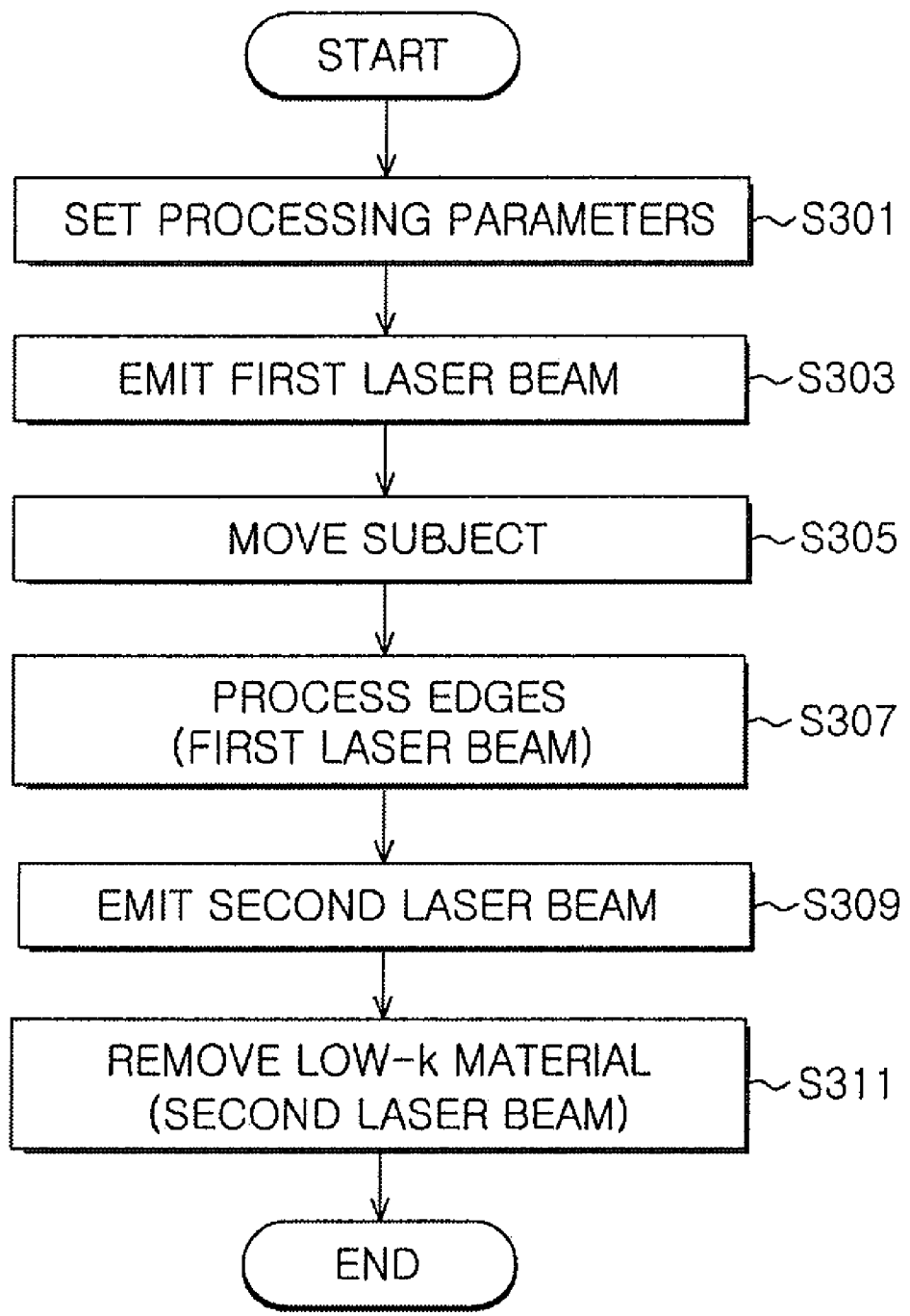
FIG. 9 is a flowchart illustrating a laser processing method according to a third embodiment of the invention.

FIG. 9 is a flowchart illustrating a laser processing method according to a third embodiment of the invention.

In order to simultaneously process the edges of the removal subject region of the subject on which the low-k material is formed and the remaining material between the edges, first, processing parameters are set according to the kind and processing type of the processing subject (S301). For example, the locations of the edges of the low-k material in the removal subject region, the interval between the edges, and output power of the first and second laser beams are set as the processing parameters.

Then, the first laser beam is emitted from the first laser generating unit 120 (S303), and the stage is moved by the stage moving unit 18 so as to move the subject 14 in a direction opposite to a processing direction (S305). Even though the movement of the subject is not essential, if moving the subject in the direction opposite to the processing direction, it is possible to increase the processing speed.

The laser beam that is emitted from the first laser generating unit 120 is incident on the two edges of the low-k material in the removal subject region through the first mirror 10 and the optical system 12, thereby removing the edges (S307).

Then, the second laser beam is emitted from the second laser generating unit 122 (S309), and is irradiated between the two edges of the low-k material in the removal subject region through the second mirror 11, thereby removing the remaining low-k material between the two edges (S311). As such, the edges of the low-k material in the removal subject region and the remaining low-k material between the two edges are simultaneously removed. As a result, it is possible to process the subject having excellent processing characteristic while maintaining a high-speed operation.

Figure 10:
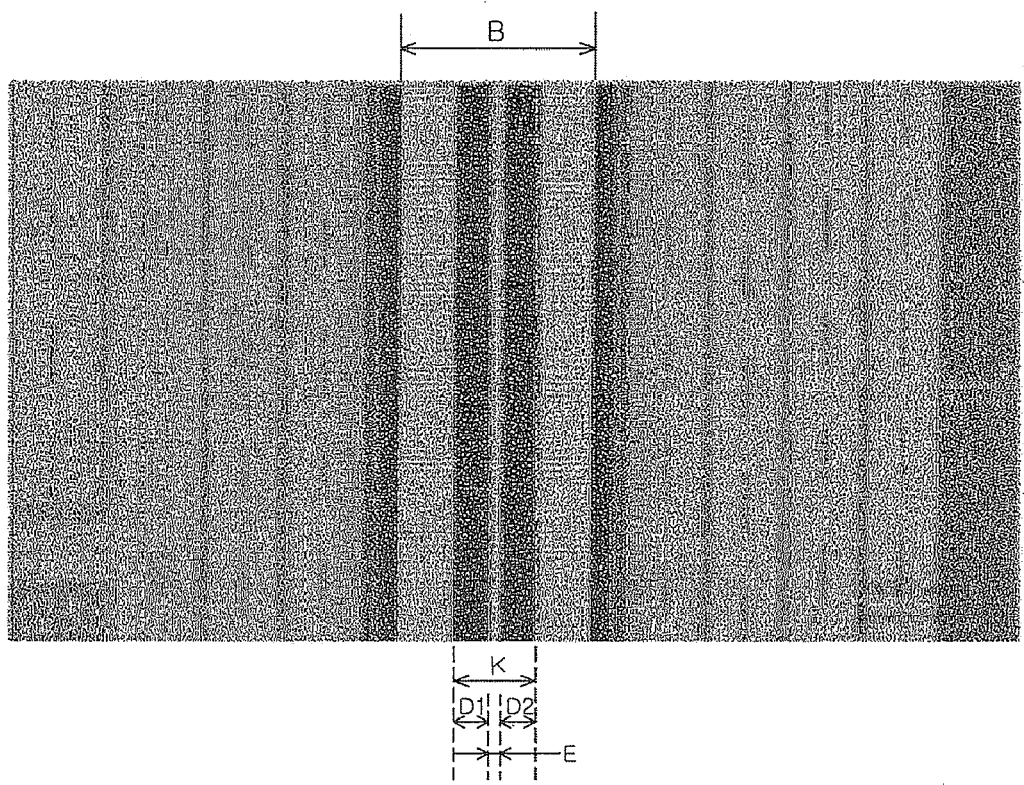
FIG. 10 is a diagram illustrating a result that is obtained by removing a low-k material using a laser processing apparatus of the invention.

FIG. 10 is a diagram illustrating a result that is obtained by removing a low-k material using a laser processing apparatus of the invention.

Referring to FIG. 10, two edges D1 and D2 of a region K where a low-k material, which needs to be removed in a low-k material on an entire saw lane B, is formed is removed using the laser processing apparatus shown in FIG. 3, and the remaining low-k material E is removed by a mechanical processing method or laser processing method, which will be performed hereinafter.

As shown in the drawing, it can be seen that the edges D1 and D2 of the low-k material in the removal subject region are removed and a lower subject is exposed to the outside. The low-k material remains between the two edges D1 and D2. The remaining low-k material can be removed subsequently by a mechanical processing method or laser processing method.

First, the low-k material of the edges is simultaneously removed by the two split laser beams and the removal subject region is defined. Therefore, when removing the low-k material in a subsequent process, the low-k material in a region other than the removal subject region can be prevented from being removed. As can be seen from FIG. 10, the edges are accurately and sharply processed, which improves a manufacture characteristic.

The description has been given to the case where, in order to process the subject where the low-k material is formed, a laser beam is split into two laser beams to remove the edges of the removal subject region, and the low-k material between the edges is removed at the same time as (or after) removing the edges.

However, when the low-k material between the edges is removed using a laser beam at the same time as (or after) splitting the laser beam into two laser beams to remove the low-k material of the edges, the aperture of the laser beam needs to be adjusted according to the interval between the edges. In FIGS. 6 and 8, the aperture of the laser beam that is emitted from the second mirror 11 should have a size corresponding to a value that is obtained by subtracting the width of the removal subject region by the widths of the edges, which are removed by the two split laser beams.

At this time, when the interval between the edges is large, the aperture of the laser beam also increases and the strength of the laser beam becomes weak. As a result, even after the low-k material of the edges is removed, the low-k material may remain between the edges.

Accordingly, when removing the low-k material remaining even after removing the low-k material of the edges, it is not possible to ensure the predetermined moving speed of a blade due to physical resisting power that is applied from the low-k material to the blade.

Thus, in another embodiment of the invention, while removing the low-k material of the edges using two split first laser beams, the volume of the low-k material between the edges is reduced using at least two split second laser beams. As a result, it is possible to minimize physical resisting power that is applied to the blade from the remaining low-k material after line processing in a subsequent process using the blade.

Figure 11A:
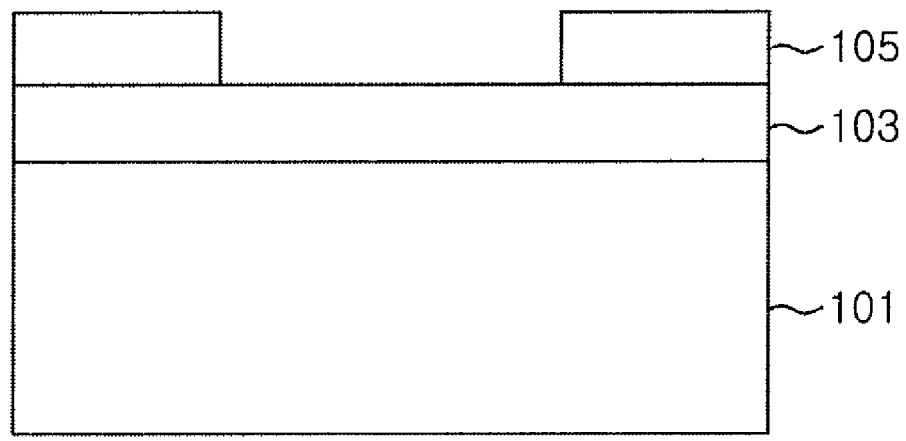
FIGS. 11A and 11B are diagrams illustrating the concept of removing a low-k material using a plurality of laser beams.
Figure 11B:
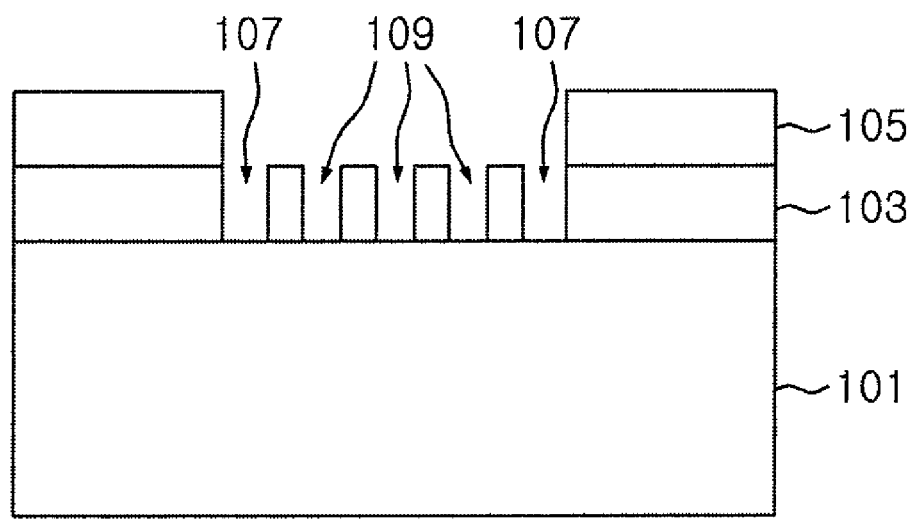

FIGS. 11A and 11B are diagrams illustrating a concept of removing a low-k material using a plurality of laser beams.

First, FIG. 11A shows a state where a low-k material 103 is formed on a semiconductor substrate 101 and chips 105 are formed in a predetermined region.

In the case in which the low-k material is removed to separate the chips 105 from each other, as shown in FIG. 11B, the low-k material of the edges 107 in the removal subject region is removed while at least a part of the low-k material in a region 109 between the edges is line-processed.

In this way, it is possible to minimize resistance due to the low-k material during a subsequent process using the blade.

Figure 12:
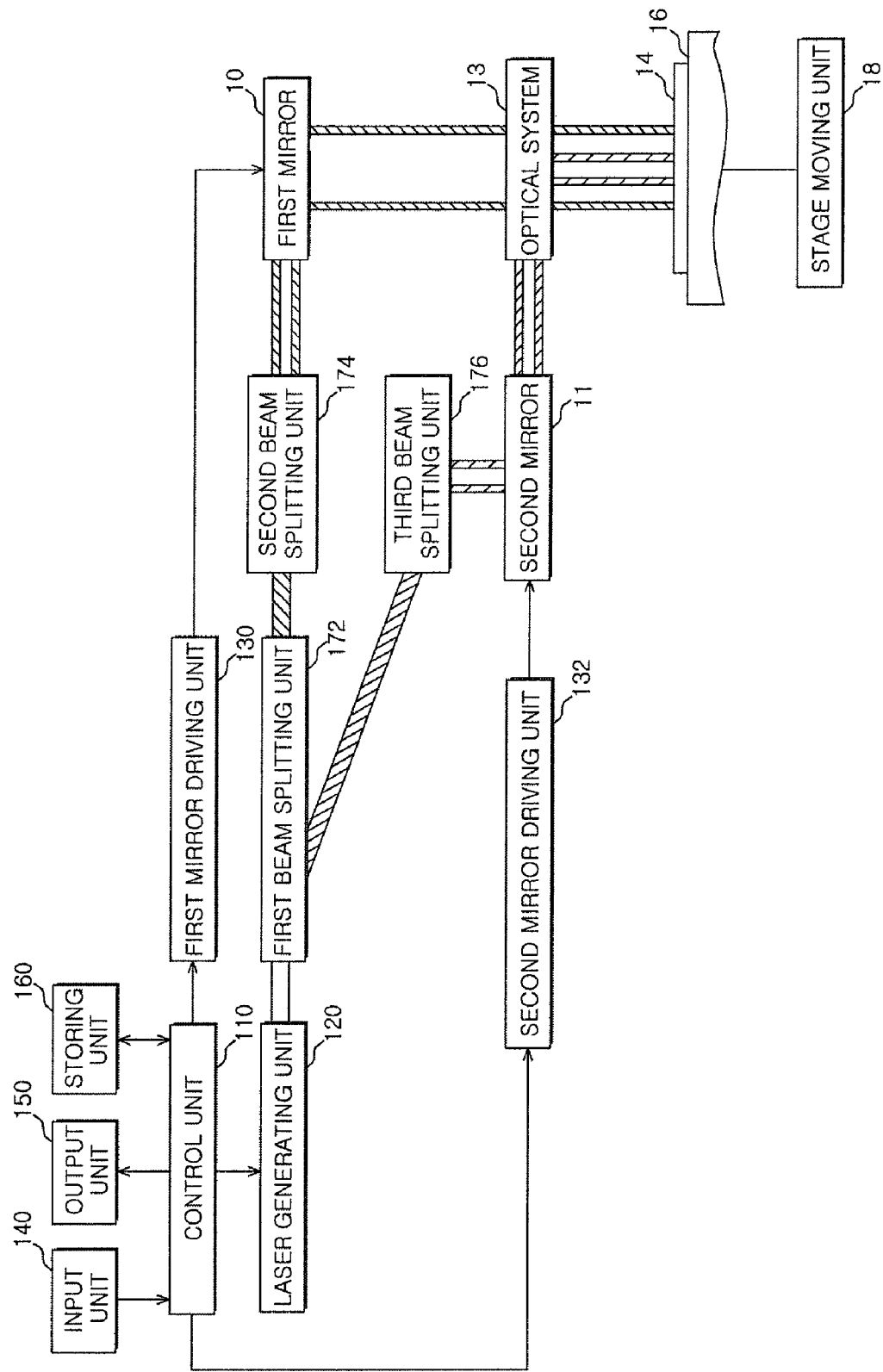
FIG. 12 is a diagram illustrating a structure of a laser processing apparatus according to a fourth embodiment of the invention.

FIG. 12 is a diagram illustrating a structure of a laser processing apparatus according to a fourth embodiment of the invention.

The laser processing apparatus according to this embodiment includes a first beam splitting unit 172, a second beam splitting unit 174, and a third beam splitting unit 176. The first beam splitting unit 172 splits a laser beam emitted from the laser generating unit 120 into two laser beams, and the second beam splitting unit 174 splits a first laser beam emitted from the first beam splitting unit 174 into two laser beams to irradiate the split laser beams onto the edges of the removal subject region. The third beam splitting unit 176 splits a second laser beam emitted from the first beam splitting unit 172 into at least two laser beams so as to irradiate the split laser beams between the edges of the removal subject region.

The laser beams that are split into two by the second beam splitting unit 174 are irradiated onto the edges of the subject 14 through the first mirror 10 and the optical system 13 serving as a condensing lens. At the same time, the laser beams that are split into at least two by the third beam splitting unit 176 are irradiated between the edges of the subject 14 through the second mirror 11 and the optical system 13, and the split laser beams are arranged in a direction vertical to a processing direction.

For this purpose, the interval between the laser beams that are split by the second beam splitting unit 174 is controlled to be the same as the width of the removal subject region. Further, the at least two laser beams that are emitted from the third beam splitting unit 176 are controlled to be arranged between the two laser beams, which are emitted from the second beam splitting unit 174.

The first beam splitting unit 172 that splits the laser beam emitted from the laser generating unit 120 into two or the second beam splitting unit 174 that splits the first laser beam emitted from the first beam splitting unit 172 into two may be configured using the optical system 12 shown in FIG. 4 or the beam splitting unit shown in FIGS. 13 and 14.

Further, the third beam splitting unit 176 that splits the second laser beam emitted from the first beam splitting unit 172 into at least two may be configured using any one of the beam splitting units shown in FIG. 4 and FIGS. 13 to 16 according to the number of split laser beams. Hereinafter, a structure of a beam splitting unit that splits a laser beam into two, three or four will be exemplified.

Figure 13A:
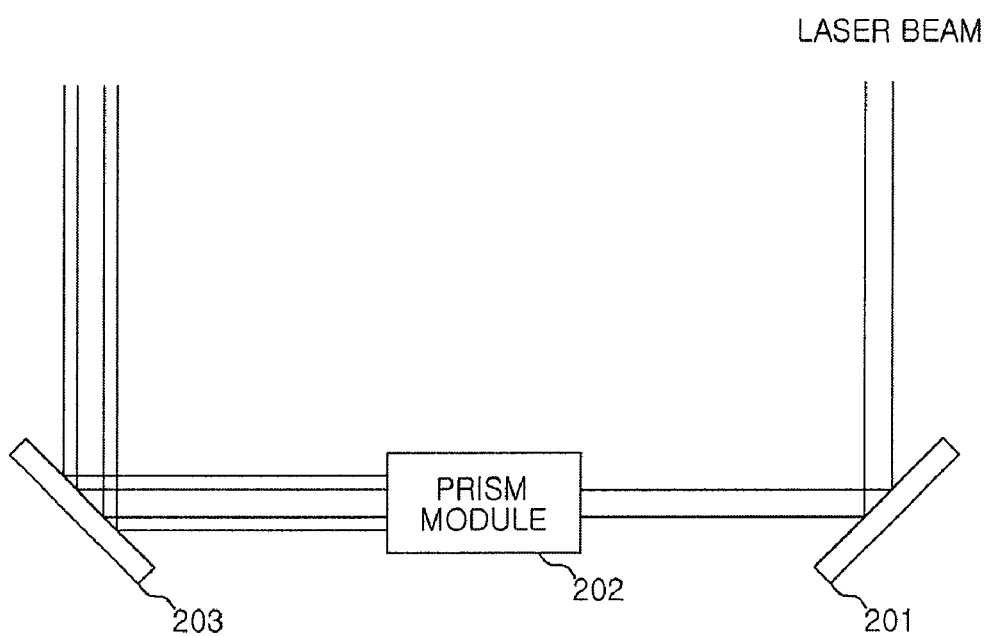
FIGS. 13 to 16 are exemplary views illustrating a beam splitting unit that is applied to a structure shown in FIG. 12.
Figure 13B:
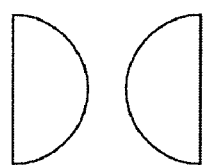

First, FIGS. 13a and 13b are diagrams illustrating a structure of a beam splitting unit that splits a laser beam into two using a prism. In this structure, the beam splitting unit includes a mirror #1 (201) that reflects a laser beam, a prism module 202 that splits the laser beam reflected on the mirror #1(201) into two, and a mirror #2 (203) that reflects the laser beams split into two by the prism module 202.

Here, the mirror #1 (201) allows a laser beam to be incident on the prism module 202, and the prism module 202 allows the two laser beams split on the basis of the arrangement to become symmetrical to each other. The mirror #2 (203) controls an optical axis of the laser beam emitted from the prism module 202 such that the optical axis of the laser beam becomes horizontal to an optical axis of the laser beam incident on the mirror #1 (201), and the laser beam that is reflected on the mirror #2 (203) is incident on another beam splitting unit or mirrors 10 and 11.

An example of sections of the laser beams that are split by the beam splitting unit is as shown in FIG. 13B. The interval between the two semicircular laser beams may be changed according to a refractive index of the beam in the prism module 202.

Figure 14A:
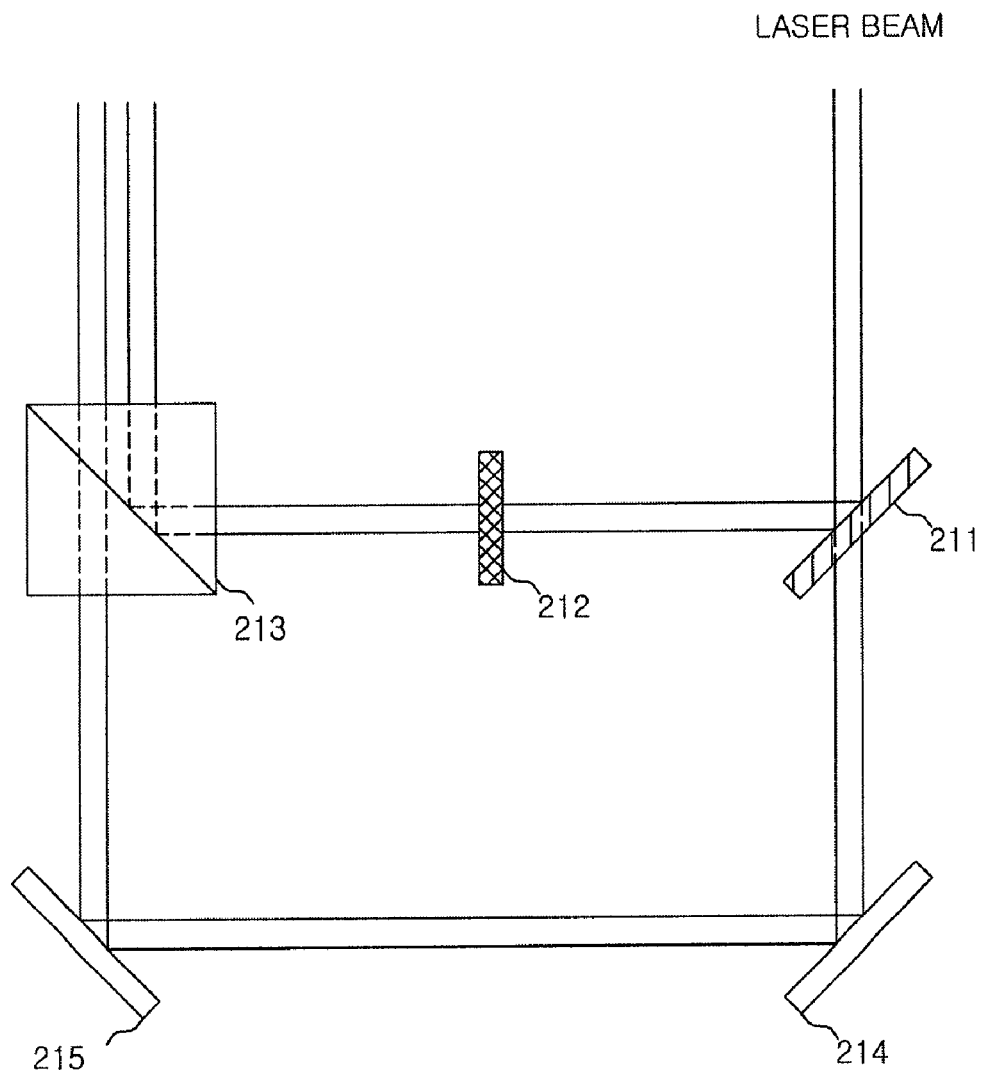
Figure 14B:
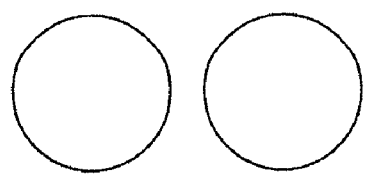

Meanwhile, FIGS. 14A and 14B show the case where a laser beam is split into two laser beams by a beam splitter. In this case, the beam splitting unit includes a beam splitter 211, a polarizer 212, a mirror #1 (214), a mirror #2 (215), and a polarized beam splitter 213. The beam splitter 211 splits an incident laser beam into two laser beams, and the polarizer 212 converts a polarization characteristic of a first laser beam that is reflected on the beam splitter 211. The mirror #1 (214) reflects a second laser beam that is transmitted through the beam splitter 211, and the mirror #2 (215) reflects the second laser beam that is reflected on the mirror #1 (214). The polarized beam splitter 213 reflects the first laser beam whose polarization characteristic is converted by the polarizer 212 and transmits the second laser beam that is reflected on the mirror #2 (215).

An example of sections of the first and second laser beams in the beam splitting unit is as shown in FIG. 14B, and the interval between the two laser beams may be controlled by changing the location of the mirror #2 (215).

Of course, an optical axis of a laser beam that is emitted from the polarized beam splitter 213 is controlled such that the optical axis is parallel to an optical axis of a laser beam incident on the beam splitter 211.

The polarizer 212 may be a polarizer that converts horizontally linear polarization (P polarization) into vertically linear polarization (S polarization), and the polarized beam splitter 213 may be a polarized beam splitter that transmits P polarization and reflects S polarization.

Figure 15A:
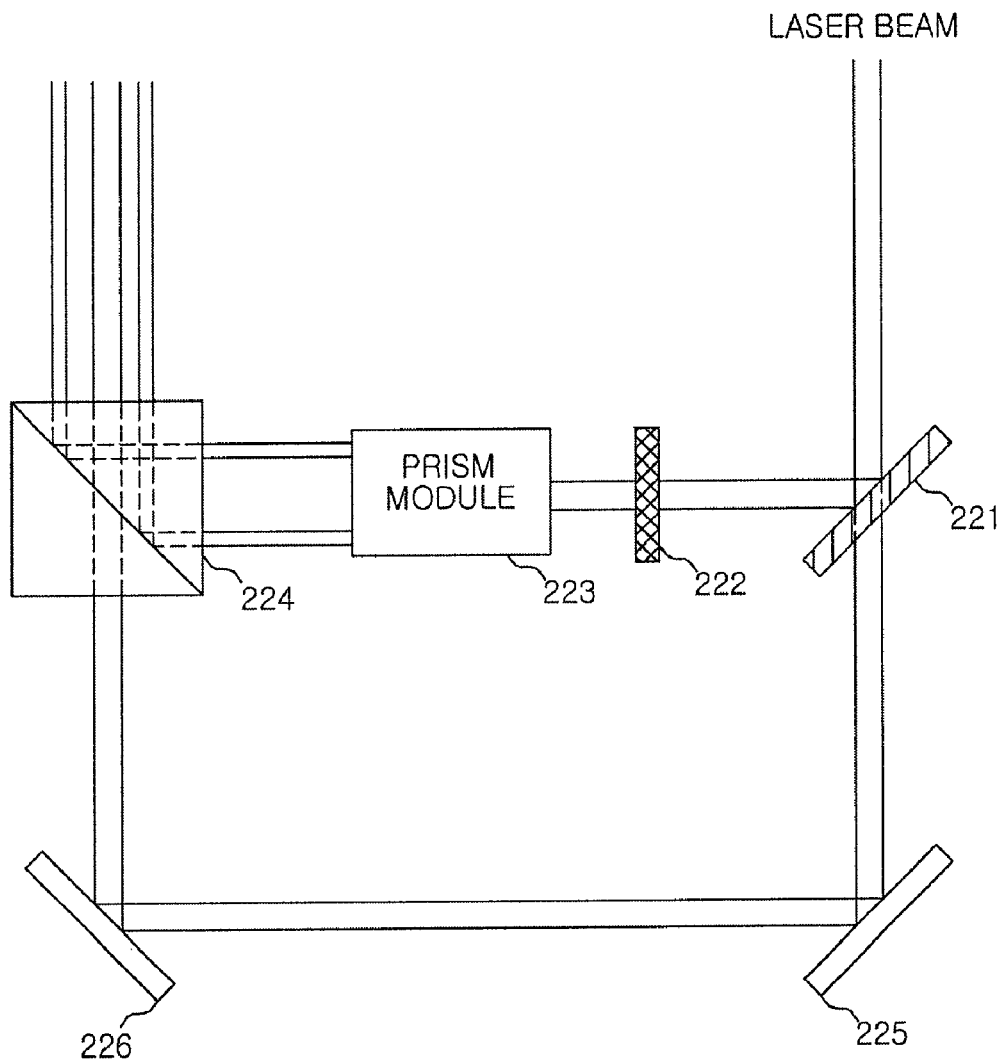
Figure 15B:
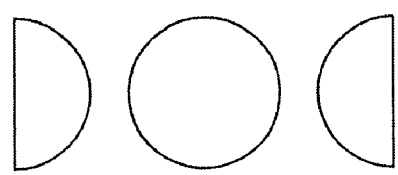

FIGS. 15A and 15B are exemplary views illustrating a beam splitting unit that splits a laser beam into three.

In the beam splitting unit according to this embodiment, a laser beam is split into two using a beam splitter and one of the two split laser beams is split again into two using a prism. After all, the beam splitting unit splits the laser beam into three.

Referring to FIG. 15A, the beam splitting unit includes a beam splitter 221, a polarizer 222, a prism module 223, a mirror #1 (225), a mirror #2 (226), and a polarized beam splitter 224. The beam splitter 221 splits an incident laser beam into two laser beams, and the polarizer 222 converts a polarization characteristic of a laser beam that is reflected on the beam splitter 221. The prism module 223 splits the laser beam whose polarization characteristic is converted by the polarizer 222 into first and second laser beams. The mirror #1 (225) reflects a third laser beam that is transmitted through the beam splitter 221, and the mirror #2 (226) reflects the third laser beam that is reflected on the mirror #1 (225). The polarized beam splitter 224 reflects the first and second laser beams that are emitted from the prism module 223 and transmits the third laser beam that is incident through the mirror #2 (226).

An example of sections of the laser beams that are split by the beam splitting unit according to this embodiment is as shown in FIG. 15B. The refractive index of the prism module 223 is controlled to adjust the interval between the first and second laser beams. Meanwhile, the arrangement of the prism module 223 is controlled to allow the two laser beams to become symmetrical to each other. The location of the mirror #2 (226) may be controlled to adjust the location of the third laser beam.

Figure 16A:
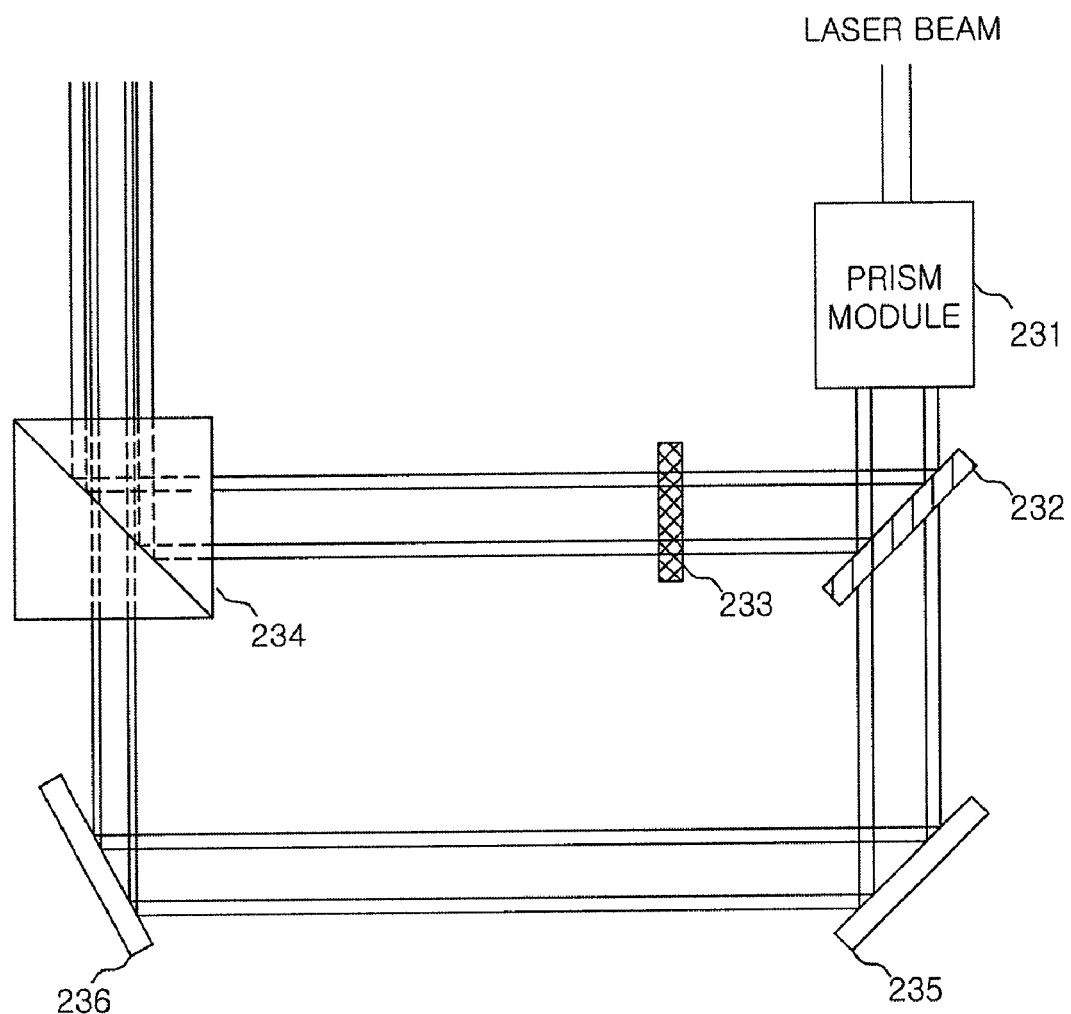
Figure 16B:
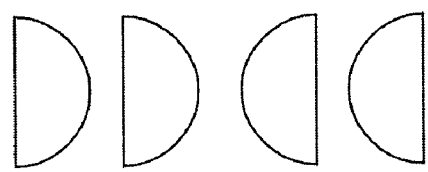

In this case, the polarizer 222 may be a polarizer that converts horizontally linear polarization (P polarization) into vertically linear polarization (S polarization), and the polarized beam splitter 223 may be a polarized beam splitter that transmits P polarization and reflects S polarization. FIGS. 16A and 16B are exemplary views illustrating a beam splitting unit that splits a laser beam into four.

In this embodiment, one laser beam is split into two laser beams using a prism, and each of the two split laser beams is split into two laser beams using a beam splitter. That is, one laser beam is split into four laser beams.

Referring to FIG. 16A, the beam splitting unit includes a prism module 231, a beam splitter 232, a polarizer 233, a mirror #1 (235), a mirror #2 (236), and a polarized beam splitter 234. The prism module 231 splits an incident laser beam into two laser beams, the beam splitter 232 splits each of the two laser beams split by the prism module 231 into two and reflects and transmits the split laser beams, and the polarizer 233 converts polarization characteristics of first and second laser beams that are reflected on the beam splitter 232. The mirror #1(235) reflects third and fourth laser beams that are transmitted through the beam splitter 232, and the mirror #2 (236) reflects the laser beam that is reflected on the mirror #1 (235). The polarized beam splitter 234 reflects the first and second laser beams whose polarization characteristics are converted by the polarizer 233 and transmits the third and fourth laser beams that are incident through the mirror #2 (236).

An example of sections of the laser beams that are split by the beam splitting unit according to this embodiment is as shown in FIG. 16B. The intervals between the first to fourth laser beams may be changed by controlling the refractive index of the prism module 231 or the arrangement of the mirror #2 (236). Of course, an optical axis of the laser beam that is reflected on the mirror #2 (236) is parallel to an optical axis of a laser beam that is incident on the prism 231.

As such, in this invention, the laser beams that are split into two by the second beam splitting unit 174 are irradiated onto the edges (refer to 107 of FIG. 11B) of the processing region, and the laser beams that are split into two to four by the third beam splitting unit 176 are irradiated onto the portions (refer to 109 of FIG. 11B) between the edges of the processing region. Therefore, in a state where the low-k material is primarily removed using a laser beam and the volume of the laser beam is reduced, the remaining low-k material can be easily removed using a blade.

Figure 17:
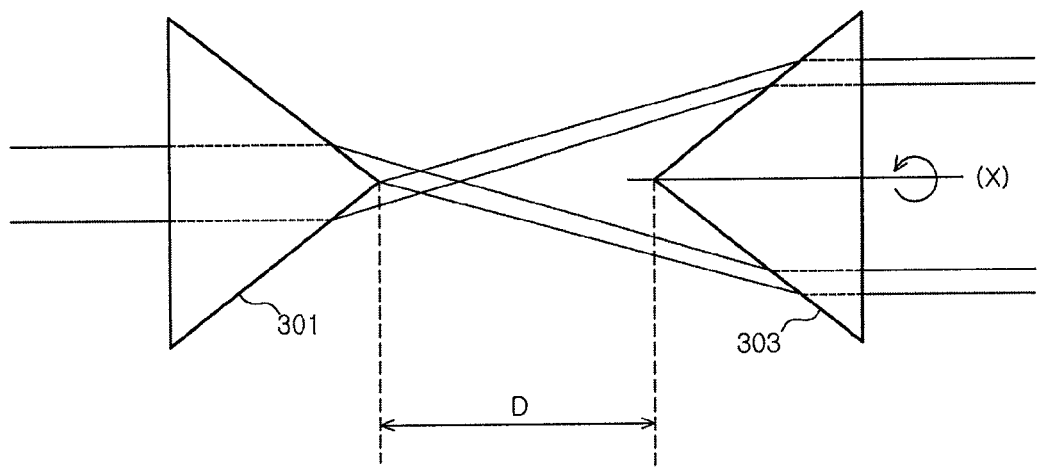

Each of the prism modules 202, 223, and 231 that are used in the beam splitting units shown in FIGS. 13, 15, and 16 may be composed of a pair of triangular prisms, and an example thereof is shown in FIG. 17.

Figure 19:
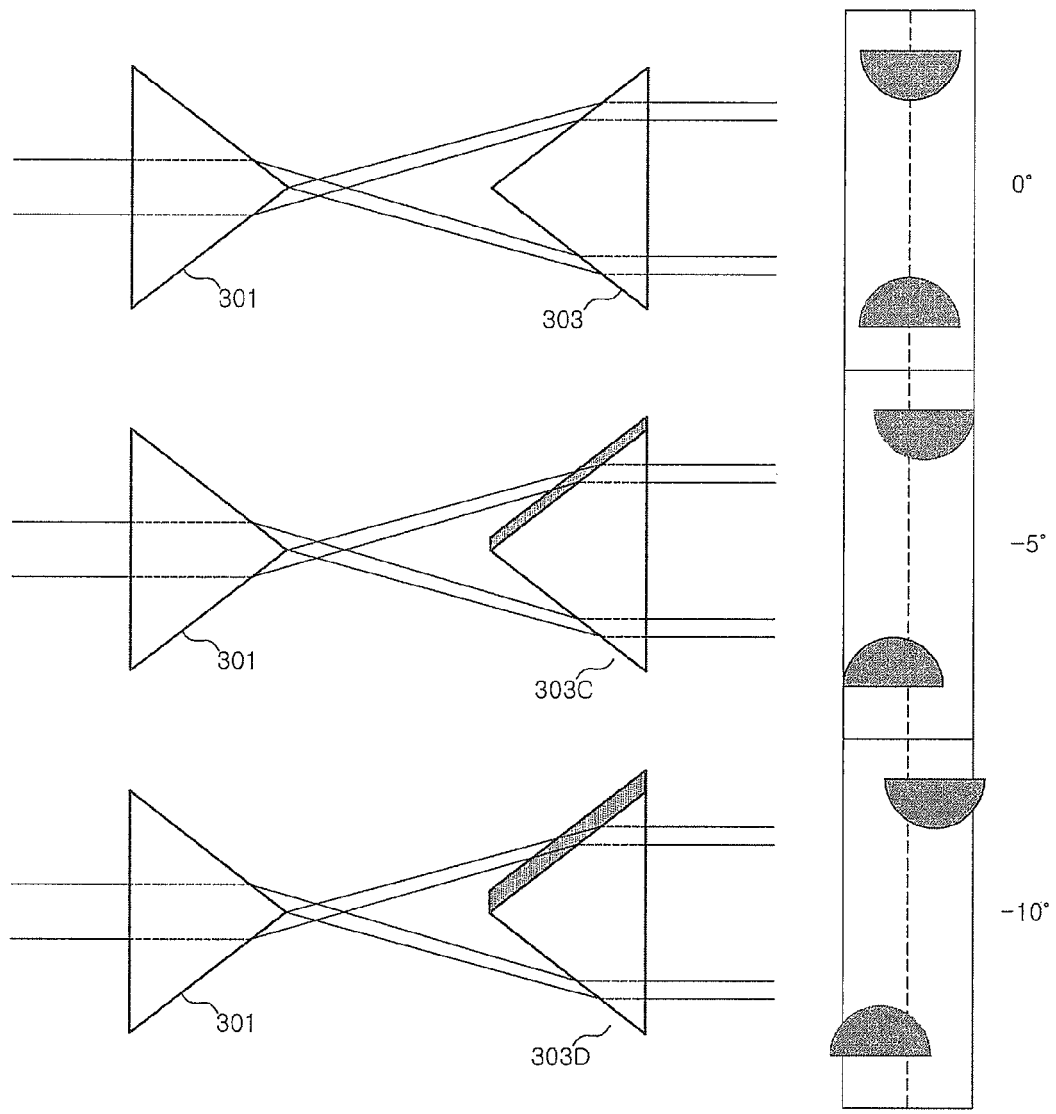

FIGS. 17 to 19 are diagrams illustrating the concept of splitting a beam by a beam splitting unit using a prism.

First, FIG. 17 is an exemplary view illustrating the prism modules 202, 223, and 231. In this case, each of the prism modules includes a first prism 301 that splits an incident laser beam into two and a second prism 303 that changes directions of the laser beams split by the first prism such that the laser beams are parallel to each other.

A folding angle of each of the first and second prisms 301 and 303 is preferably set to 120 degrees.

In this prism module, if the interval D between the first prism 301 and the second prism 303 is controlled, the sizes of the two split laser beams may be adjusted. If an optical axis X of the second prism 303 is adjusted, the interval between the two split laser beams may be changed.

FIGS. 18 and 19 are diagrams illustrating the interval between the split beams depending on the interval between the prisms.

First, FIG. 18 shows the case where the second prism 303 rotates five and ten times in a clockwise direction.

When the optical axes of the first and second prisms 301 and 303 align each other, the laser beams that are split by the prism module are incident on a condensing lens in a parallel state and then condensed as one beam. As a result, the effect of splitting a beam cannot be obtained. Therefore, in this invention, the divergence angles of the two split laser beams are changed to adjust the interval between the split beams.

FIG. 19 shows the case where the second prism rotates five and ten times in a counterclockwise direction.

As can be seen from FIGS. 18 and 19, if the second prism 303 is minutely adjusted along the optical axis X, the interval between the two split laser beams can be changed.

Hereinafter, a laser processing method using the laser processing apparatus according to the fourth embodiment of the invention that has been described above will be described.

Figure 20:
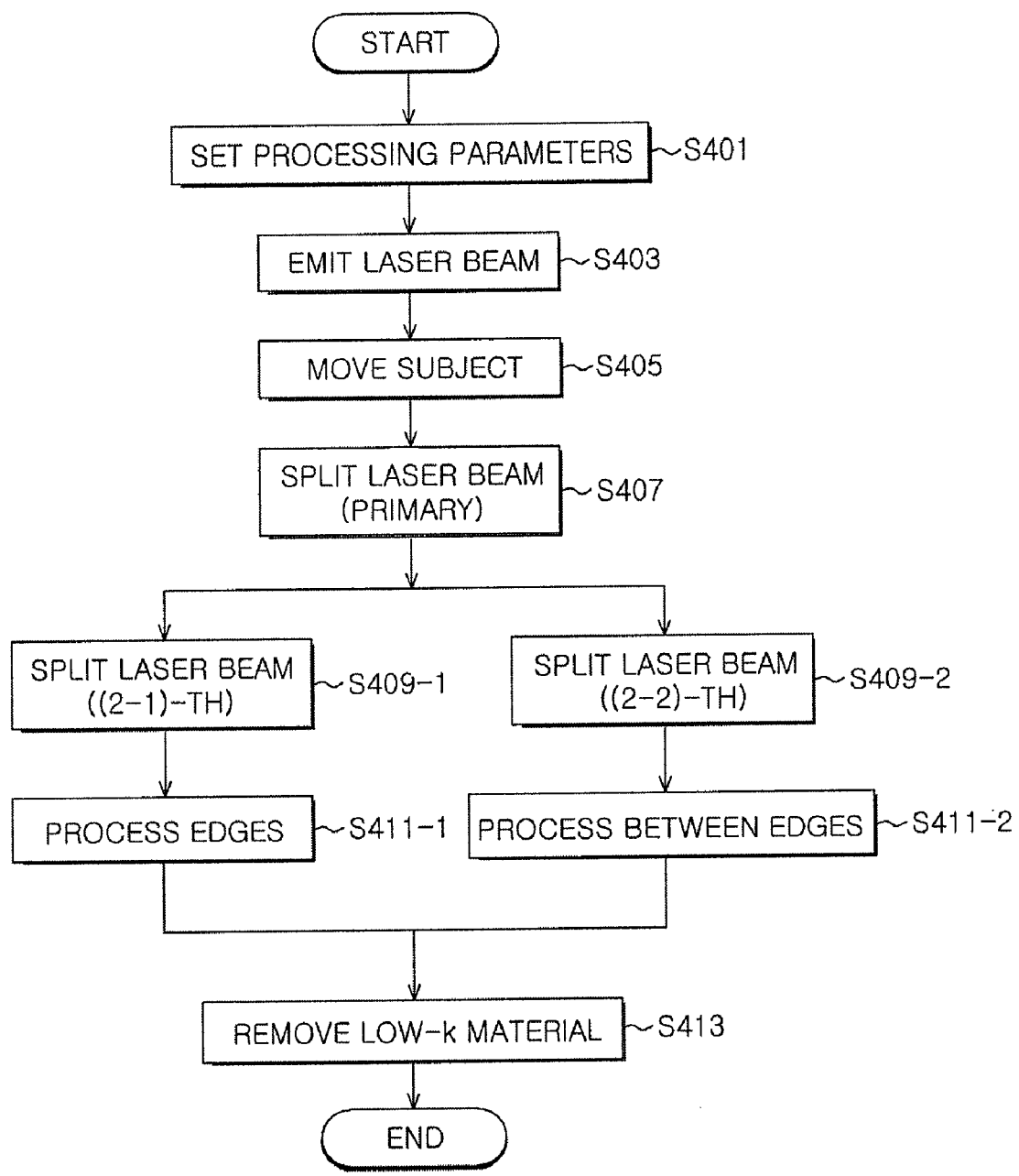
FIG. 20 is a flowchart illustrating a laser processing method according to a fourth embodiment of the invention.

FIG. 20 is a flowchart illustrating a laser processing method according to a fourth embodiment of the invention.

First, processing parameters are set by the input unit 140 (S401). In the processing parameter setting process, the processing parameters are registered in a predetermined menu according to the kind or processing type of the processing subject and stored in a storage unit 160. Then, the processing parameter setting process can be easily performed by selecting from the menu, if necessary. At this time, the locations of edges of the low-k material in the removal subject region, the interval between the edges, and output power of laser beams are set as the control parameters.

If the processing parameters are completely set, the location of the first mirror 10 is adjusted by the first mirror driving unit 130 and a laser beam is emitted (S403). When the first mirror 10 is composed of a polygon mirror, the first mirror 10 rotates at a constant speed according to the predetermined rotation speed. The control unit 110 operates the stage moving unit 18 to move the subject 14 in a predetermined direction (for example, direction opposite to a processing direction where a laser beam is irradiated onto a subject) (S405).

Even though the movement of the subject is not essential, if the subject is moved to the direction opposite to the processing direction, the processing speed can be increased.

Then, a laser beam that is emitted when controlling the laser generating unit 120 is primarily split by the first beam splitting unit 172, and then incident on the second laser beam splitting unit 174 and the third laser beam splitting unit 176 (S407).

The first laser beam that is split in Step S407 is split again into two laser beams by the second laser beam splitting unit 174 (S409-1) and then incident on the two edges of the removal subject region (S411-1). The second laser beam that is split in Step S407 is split again into at least two laser beams by the third laser beam splitting unit 176 (S409-2) and then incident on portions between the edges of the removal subject region (S411-2).

Therefore, the edges of the removal subject region and the low-k material formed between the edges are simultaneously removed by the split laser beams (S413).

In the above-described embodiment, the laser beam is primarily split and each of the split laser beams is secondarily split, thereby removing the low-k material. However, the invention is not limited thereto and various changes and modifications can be made.

That is, instead of primarily splitting a laser beam, two laser generating apparatuses may be used.

Figure 21:
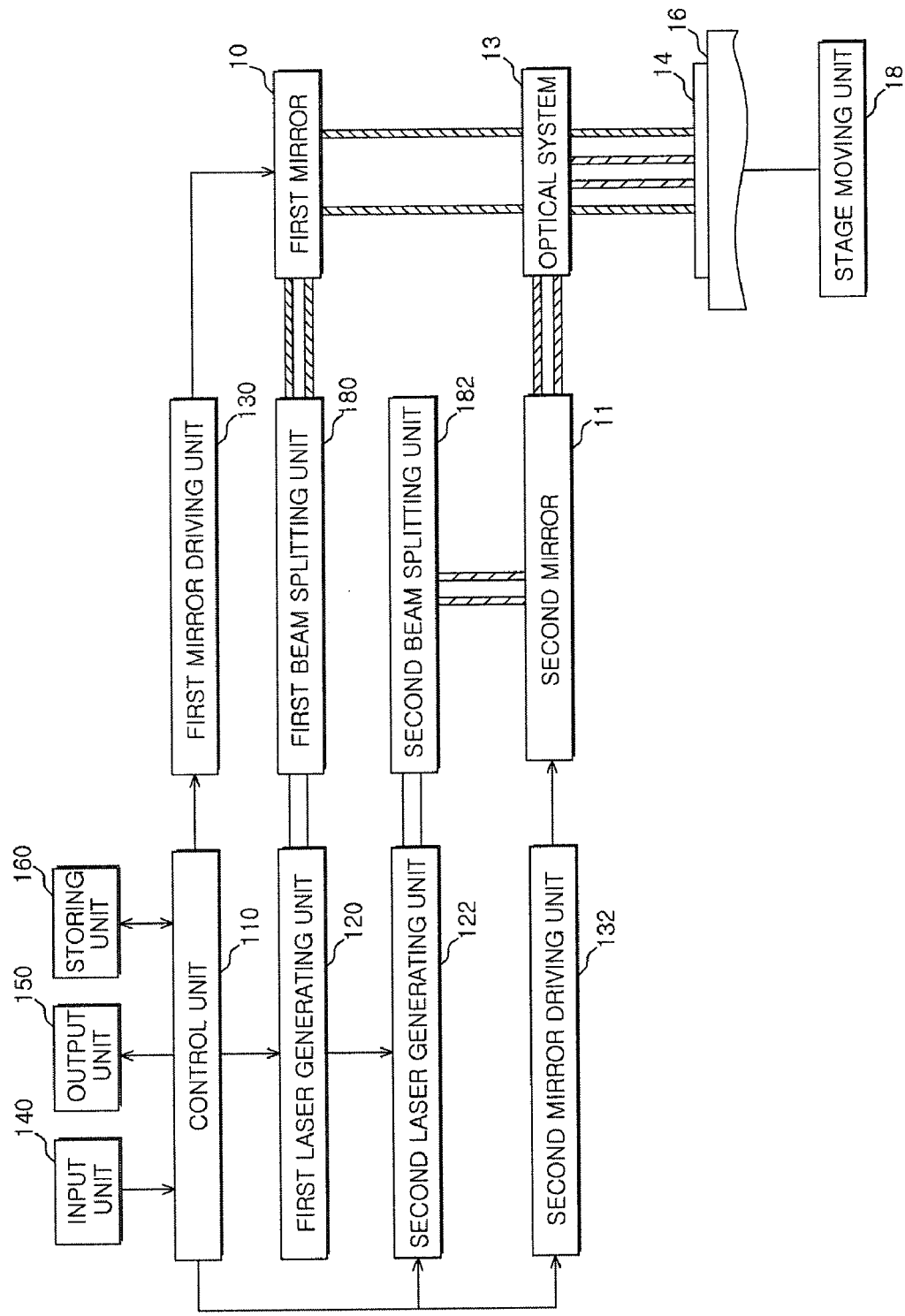
FIG. 21 is a diagram illustrating a structure of a laser processing apparatus according to a fifth embodiment of the invention.

FIG. 21 is a diagram illustrating a structure of a laser processing apparatus according to a fifth embodiment of the invention.

The laser processing apparatus according to this embodiment includes a first beam splitting unit 180 and a second beam splitting unit 182. The fist beam splitting unit 180 splits a laser beam emitted from the first laser generating unit 120 into two and irradiates the split laser beams onto the edges of the removal subject region. The second beam splitting unit 182 splits a laser beam emitted from the second laser generating unit 122 into at least two and irradiates the split laser beams onto portions between the edges of the removal subject region.

Therefore, the laser beams that are split into two by the first beam splitting unit 180 are irradiated onto the edges of the subject 14 through the first mirror 10 and the optical system 13 serving as the condensing lens. At the same time, the laser beams that are split into at least two by the second beam splitting unit 182 are irradiated onto the portions between the edges of the subject 14 through the second mirror 11 and the optical system 13, and the split laser beams are arranged in a direction vertical to a processing direction.

The principle of splitting a laser beam into two, three or four is similar to that shown in FIGS. 4, 13, and 16, which has been described above, and thus the detailed description thereof will be omitted.

FIG. 22 is a flowchart illustrating a laser processing method according to a fifth embodiment of the invention.

In order to process the subject using the laser processing apparatus shown in FIG. 21, first, processing parameters are set by the input unit 140 (S501). In the processing parameter setting process, the processing parameters are registered in a predetermined menu according to the kind or processing type of the processing subject and stored in a storage unit 160. Then, the processing parameter setting process can be easily performed by selecting from the menu, if necessary.

If the processing parameters are completely set, the locations of the first and second mirrors 10 and 11 are adjusted by the first and second mirror driving units 130 and 132 and the first and second laser beams are emitted (S503-1 and S503-2). When each of the first and second mirrors 10 and 11 is composed of a polygon mirror, each mirror rotates at a constant speed according to the predetermined rotation speed. The control unit 110 operates the stage moving unit 18 to move the subject 14 in a predetermined direction (for example, direction opposite to a processing direction where a laser beam is irradiated onto a subject) (S505).

Even though the movement of the subject is not essential, if the subject is moved to the direction opposite to the processing direction, the processing speed can be increased.

Then, a laser beam that is emitted from the first laser generating unit 120 is split into two by the first beam splitting unit 180 (S507-1), and the split laser beams are incident on the two edges of the removal subject region (S509-1). The laser beam that is emitted from the second laser generating unit 122 is split into at least two by the second beam splitting unit 182 (S507-2) and the split laser beams are incident on the portions between the edges of the removal subject region (S509-2).

Therefore, the edges of the removal subject regions and the low-k material formed between the edges are simultaneously removed by the split laser beams (S511).

In this embodiment, the first and second laser beams are simultaneously emitted, but the invention is not limited thereto. That is, the first laser beam is emitted to remove the low-k material of the edges and then the second laser beams is emitted to remove the low-k material between the edges.

Meanwhile, in the fourth and fifth embodiments of the invention, each of the first and second mirrors 10 and 11 may be composed of a polygon mirror. In particular, it is preferable to control the number of reflection surfaces, such that the aperture of the laser beam covers a plurality of reflection surfaces of the polygon mirror.

The laser beam is split into at least four and two laser beams thereof are irradiated onto the edges of the removal subject region and the other laser beams are irradiated onto the region between the edges of the removal subject region. In this case, during a subsequent process in which the remaining low-k material is completely removed, it is possible to minimize physical resisting power due to the low-k material. Therefore, it is possible to obtain an excellent processing characteristic and processing speed.

It will be apparent to those skilled in the art that various modifications and changes may be made without departing from the scope and spirit of the invention Therefore, it should be understood that the above embodiments are not limitative, but illustrative in all aspects. The scope of the invention is defined by the appended claims rather than by the description preceding them, and therefore all changes and modifications that fall within metes and bounds of the claims, or equivalents of such metes and bounds are therefore intended to be embraced by the claims.

INDUSTRIAL APPLICABILITY

According to the invention, even though the structure of the optical system is greatly changed in the case where the low-k material is removed using a laser beam, the remaining low-k material is removed after removing the edges of the low-k material in the removal subject region, which improves the processing speed and productivity.

Further, a laser beam is split into two or more laser beams to remove the edges of the low-k material and the low-k material between the edges is simultaneously removed by a plurality of laser beams, which further improves processing efficiency of the subject.

Meanwhile, a laser beam is split into at least four laser beams, and two laser beams thereof are irradiated onto the edges of the removal subject region and the other laser beams are irradiated onto the region between the edges of the removal subject region. In this case, during a subsequent process in which the remaining low-k material is completely removed, it is possible to minimize physical resisting power due to the low-k material. Therefore, it is possible to obtain an excellent processing characteristic and a processing speed.

The invention claimed is:

1. A laser processing apparatus that processes a subject on which a low-k material is formed, the laser processing apparatus comprising:
a laser generating unit that emits a laser beam; and
an optical system that splits the laser beam emitted from the laser generating unit into two and irradiates the split laser beams onto the subject, wherein the optical system includes a pair of condensing lenses in which cut surfaces that are cut at a predetermined distance from central axes to be parallel to the central axes contact with each other, and the interval between the two split laser beams is the same as the interval between two edges of the low-k material in a removal subject region.

2. The laser processing apparatus of claim 1,
wherein each of the laser beams that have passed through the optical system is shaped to have an elliptical shape by a cylindrical lens, before being irradiated onto the subject.

3. A laser processing apparatus that processes a subject on which a low-k material is formed, the laser processing apparatus comprising:

a laser generating unit that emits a laser beam;
a beam splitting unit that splits the laser beam emitted from the laser generating unit into two;
an optical system that splits a first laser beam split by the beam splitting unit into two, such that the interval between the two split laser beams is the same as the interval between two edges of the low-k material in a removal subject region, and irradiates the split laser beams onto the subject; and
a mirror that receives a second laser beam split by the beam splitting unit and allows the second laser beam to be irradiated onto the low-k material between the two edges,
wherein the optical system includes a pair of condensing lenses in which cut surfaces that are cut at a predetermined distance from central axes to be parallel to the central axes contact with each other.

4. The laser processing apparatus of claim 3,
wherein an aperture of the second laser beam is the same as the interval between the two edges.

5. The laser processing apparatus of claim 3,
wherein the beam splitting unit includes a prism module that splits an incident laser beam into two.

6. The laser processing apparatus of claim 3,
wherein the mirror is composed of a polygon mirror.

7. The laser processing apparatus of claim 3,
wherein the mirror is composed of a polygon mirror of which the number of reflection surfaces is controlled, such that an aperture of the laser beam covers a plurality of reflection surfaces of the polygon mirror.

8. A laser processing apparatus that processes a subject on which a low-k material is formed, the laser processing apparatus comprising:

a first laser generating unit that emits a laser beam;
an optical system that splits the laser beam emitted from the first laser generating unit into two, such that the interval between the two split laser beams is the same as the interval between two edges of the low-k material in a removal subject region, and allows the split laser beams to be incident on the subject;
a second laser generating unit that emits a laser beam; and
a mirror that allows the laser beam emitted from the second laser generating unit to be irradiated onto the low-k material between the two edges,
wherein the optical system includes a pair of condensing lenses in which cut surfaces that are cut at a predetermined distance from central axes to be parallel to the central axes contact with each other.

9. The laser processing apparatus of claim 8,
wherein the second laser generating unit is driven the predetermined time after the first laser generating unit is driven.

10. The laser processing apparatus of claim 8,
wherein an aperture of the laser beam that is emitted from the second laser generating unit is controlled to be the same as the interval between the two edges.

11. The laser processing apparatus of claim 8,
wherein the mirror is composed of a polygon mirror.

12. The laser processing apparatus of claim 8,
wherein the mirror is composed of a polygon mirror of which the number of reflection surfaces is controlled, such that an aperture of the laser beam covers a plurality of reflection surfaces of the polygon mirror.

13. A laser processing apparatus that processes a subject on which a low-k material is formed, the laser processing apparatus comprising:

a laser generating unit that emits a laser beam;
a first laser beam splitting unit that splits the laser beam emitted from the laser generating unit into two;
a second laser beam splitting unit that splits a first laser beam emitted from the first laser beam splitting unit into two and irradiates the split laser beams onto two edges of the low-k material in a removal subject region; and
a third laser beam splitting unit that splits a second laser beam emitted from the first laser beam splitting unit into at least two and irradiates the splits laser beams onto a region between the edges of the removal subject region.

14. The laser processing apparatus of claim 13,
wherein the laser beams that are split into at least two by the third laser beam splitting unit are arranged in a direction vertical to a processing direction of the subject.

15. The laser processing apparatus of claim 13,
wherein each of the first to third laser beam splitting units includes a pair of condensing lenses in which cut surfaces that are cut at a predetermined distance from central axes to be parallel to the central axes contact with each other.

16. The laser processing apparatus of claim 13,
wherein each of the first to third laser beam splitting units includes a prism module that splits an incident laser beam into two.

17. The laser processing apparatus of claim 13 or 16,
wherein each of the first to third laser beam splitting units includes:
a first mirror that reflects an incident laser beam;
a prism module that splits the laser beam reflected on the first mirror into two; and
a second mirror that reflects the laser beams split into two by the prism module.

18. The laser processing apparatus of claim 13,
wherein each of the first to third laser beam splitting units includes a beam splitter that splits an incident laser beam into two.

19. The laser processing apparatus of claim 13 or 18,
wherein each of the first to third laser beam splitting units includes:
a beam splitter that splits an incident laser beam into two;
a polarizer that converts a polarization characteristic of a first laser beam reflected on the beam splitter;
a first mirror that reflects a second laser beam transmitted through the beam splitter,
a second mirror that reflects a second laser beam reflected on the first mirror, and
a polarized beam splitter that reflects the first laser beam whose polarization characteristic has been converted by the polarizer and transmits the second laser beam reflected on the second mirror.

20. The laser processing apparatus of claim 13,
wherein the third beam splitting unit includes:
a beam splitter that splits an incident laser beam into two; and
a prism module that splits one of the laser beams split into two by the beam splitter into two.

21. The laser processing apparatus of claim 13 or 20,
wherein the third beam splitting unit includes:
a beam splitter that splits an incident laser beam into two;
a polarizer that converts a polarization characteristic of the laser beam reflected on the beam splitter;
a prism module that splits the laser beam whose polarization characteristic has been converted by the polarizer into first and second laser beams;
a first mirror that reflects a third laser beam transmitted through the beam splitter;
a second mirror that reflects the third laser beam reflected on the first mirror; and
a polarized beam splitter that reflects the first and second laser beams emitted from the prism module and transmits the third laser beam incident through the second mirror.

22. The laser processing apparatus of claim 13,
wherein the third beam splitting unit includes:
a prism module that splits an incident laser beam into two; and
a beam splitter that splits each of the laser beams split into two by the prism module into two.

23. The laser processing apparatus of claim 13,
wherein the third beam splitting unit includes:
a prism module that splits an incident laser beam into two;
a beam splitter that splits each of the laser beams split into two by the prism module into two and reflects and transmits the split laser beams;
a polarizer that converts polarization characteristics of first and second laser beams reflected on the beam splitter;
a first mirror that reflects third and fourth laser beams transmitted through the beam splitter;
a second mirror that reflects the laser beam reflected on the first mirror; and
a polarized beam splitter that, reflects the first and second laser beams whose polarization characteristics have been converted by the polarizer and transmits the third and fourth laser beams incident through the second mirror.

24. The laser processing apparatus of any one of claims 16, 20, and 22,
wherein the prism module includes:
a first prism that splits an incident laser beam into two; and
a second prism that changes directions of the laser beams split by the first prism such that the laser beams are parallel to each other.

25. The laser processing apparatus of claim 13, further comprising:
a cylindrical lens that shapes a sectional shape of the laser beam into an elliptical shape before the laser beam is irradiated onto the subject.

26. A laser processing apparatus that processes a subject on which a low-k material is formed, the laser processing apparatus comprising:
a first laser generating unit that emits a laser beam;
a first laser beam splitting unit that splits the laser beam emitted from the first laser generating unit into two and irradiates the laser beams onto edges of a removal subject region of the low-k material at both sides;
a second laser generating unit that emits a laser beam; and
a second laser beam splitting unit that splits a second laser beam emitted from the second laser generating unit into at least two and irradiates the split laser beams onto a region between the edges of the removal subject region.

27. The laser processing apparatus of claim 26,
wherein the laser beams that are split into at least two by the second laser beam splitting unit are arranged in a direction vertical to a processing direction of the subject.

28. The laser processing apparatus of claim 26,
wherein each of the first and second laser beam splitting units includes a pair of condensing lenses in which cut surfaces that are cut at a predetermined distance from central axes to be parallel to the central axes contact with each other.

29. The laser processing apparatus of claim 26,
wherein each of the first and second laser beam splitting units includes a prism module that splits an incident laser beam into two.

30. The laser processing apparatus of claim 26 or 29,
wherein each of the first and second laser beam splitting units includes:
a first mirror that reflects an incident laser beam;
a prism module that splits the laser beam reflected on the first mirror into two; and
a second mirror that reflects the laser beams split into two by the prism module.

31. The laser processing apparatus of claim 26,
wherein each of the first and second laser beam splitting units includes a beam splitter that splits an incident laser beam into two.

32. The laser processing apparatus of claim 26 or 31,
wherein each of the first and second laser beam splitting units includes:
a beam splitter that splits an incident laser beam into two;
a polarizer that converts a polarization characteristic of a first laser beam reflected on the beam splitter;
a first mirror that reflects a second laser beam transmitted through the beam splitter;
a second mirror that reflects the second laser beam reflected on the first mirror; and
a polarized beam splitter that reflects the first laser beam whose polarization characteristic has been converted by the polarizer and transmits the second laser beam reflected on the second mirror.

33. The laser processing apparatus of claim 26,
wherein the second beam splitting unit includes:
a beam splitter that splits an incident laser beam into two; and
a prism module that splits one of the laser beams split into two by the beam splitter into two.

34. The laser processing apparatus of claim 26 or 33,
wherein the second beam splitting unit includes:
a beam splitter that splits an incident laser beam into two;
a polarizer that converts a polarization characteristic of the laser beam reflected on the beam splitter;
a prism module that splits the laser beam whose polarization characteristic has been converted by the polarizer into first and second laser beams;
a first mirror that reflects a third laser beam transmitted through the beam splitter;
a second mirror that reflects the third laser beam reflected on the first mirror, and
a polarized beam splitter that reflects the first and second laser beams emitted from the prism module and transmits the third laser beam incident through the second mirror.

35. The laser processing apparatus of claim 26,
wherein the second beam splitting unit includes:
a prism module that splits an incident laser beam into two; and
a beam splitter that splits each of the laser beams split into two by the prism module into two.

36. The laser processing apparatus of claim 26 or 35,
wherein the second beam splitting unit includes:
a prism module that splits an incident laser beam into two;
a beam splitter that splits each of the laser beams split into two by the prism module into two and reflects and transmits the split laser beams;
a polarizer that converts polarization characteristics of first and second laser beams reflected on the beam splitter;
a first mirror that reflects third and fourth laser beams transmitted through the beam splitter;

a second mirror that reflects the laser beam reflected on the first mirror; and a polarized beam splitter that reflects the first and second laser beams whose polarization characteristics have been converted by the polarizer and transmits the third and fourth laser beams incident through the second mirror.

37. The laser processing apparatus of any one of claims 29, 33, and 35, wherein the prism module includes:

a first prism that splits an incident laser beam into two; and a second prism that changes directions of the laser beams split by the first prism such that the laser beams are parallel to each other.

38. The laser processing apparatus of claim 26, further comprising:

a cylindrical lens that shapes a sectional shape of the laser beam into an elliptical shape before the laser beam is irradiated onto the subject.

39. A laser processing method that processes a subject on which a low-k material is formed, the laser processing method comprising:

a first step of providing an optical system, which includes a pair of condensing lenses in which cut surfaces that are cut at a predetermined distance from central axes to be parallel to the central axes contact with each other;

a second step of setting processing parameters, which include locations of edges of the low-k material in a removal subject region, an interval between the edges, and output power of a laser beam;

a third step of emitting a laser beam;

a fourth step of splitting the laser beam into two using the optical system; and a fifth step of irradiating the two split laser beams onto the two edges of the low-k material in the removal subject region.

40. The laser processing method of claim 39, further comprising:

being performed between the third step and the fourth step, a (3-1)-th step of splitting the laser beam into first and second laser beams and allowing the first laser beam to be incident on the optical system; and a (3-2)-th step of irradiating the second laser beam onto a region between the two edges.

41. The laser processing method of claim 40, wherein the aperture of the second laser beam is controlled to be the same as the interval between the two edges.

42. A laser processing method that processes a subject on which a low-k material is formed, the laser processing method comprising:

a first step of providing an optical system, which includes a pair of condensing lenses in which cut surfaces that are cut at a predetermined distance from central axes to be parallel to the central axes contact with each other;

a second step of setting processing parameters, which include locations of edges of the low-k material in a removal subject region, an interval between the edges, and output power of a laser beam;

a third step of emitting a first laser beam;

a fourth step of splitting the first laser beam emitted in the third step into two using the optical system;

a fifth step of irradiating the laser beams split into two in the fourth step onto the two edges of the low-k material in the removal subject region;

a sixth step of emitting a second laser beam; and a seventh step of irradiating the second laser beam emitted in the sixth step onto a region between the two edges.

43. The laser processing method of claim 42, wherein an aperture of the second laser beam is controlled to be the same as the interval between the two edges.

44. A laser processing method that processes a subject on which a low-k material is formed, the laser processing method comprising:

a first step of setting processing parameters, which include locations of edges of the low-k material in a removal subject region, an interval between the edges, and output power of a laser beam;

a second step of emitting a laser beam;

a third step of splitting the laser beam into two;

a fourth step of splitting a first laser beam between the laser beams split into two in the third step into two and irradiating the split laser beams onto edges of the low-k material in the removal subject region at both sides; and a fifth step of splitting a second laser beam between the laser beams split into two in the third step into at least two and irradiating the split laser beams onto portions between the edges of the low-k material in the removal subject region.

45. The laser processing method of claim 44, further comprising:

after the second step, moving the subject in a direction opposite to a processing direction.

46. A laser processing method that processes a subject on which a low-k material is formed, the laser processing method comprising:

a first step of setting processing parameters, which include locations of edges of the low-k material in a removal subject region, an interval between the edges, and output power of a laser beam;

a second step of emitting a first laser beam;

a third step of splitting the first laser beam emitted in the second step into two and irradiating the split laser beams onto edges of the low-k material in the removal subject region at both sides;

a fourth step of emitting a second laser beam; and a fifth step of splitting the second laser beam emitted in the fourth step into two and irradiating the split laser beams onto a portion between the edges of the low-k material in the removal subject region.

47. The laser processing method of claim 44, further comprising:

after the second step or the fourth step, moving the subject in a direction opposite to a processing direction.

48. The laser processing method of claim 44 or 46, wherein the at least two split laser beams that are irradiated onto the portions between the two edges of the low-k material in the removal subject region are arranged in a direction vertical to the processing direction of the subject.

* * * * *